(12) United States Patent
Hutton et al.

(10) Patent No.: US 10,248,484 B2
(45) Date of Patent: Apr. 2, 2019

(54) PRIORITIZED ERROR-DETECTION AND SCHEDULING

(71) Applicant: Intel Corporation, Santa Clara, CA (US)

(72) Inventors: Michael David Hutton, Mountain View, CA (US); Sean R. Atsatt, Santa Cruz, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/438,479

(22) Filed: Feb. 21, 2017

(65) Prior Publication Data

US 2018/0239665 A1 Aug. 23, 2018

(51) Int. Cl.
*G06F 11/07* (2006.01)
*G06F 11/10* (2006.01)
*G11C 29/52* (2006.01)
*G11C 29/04* (2006.01)

(52) U.S. Cl.
CPC ...... *G06F 11/0727* (2013.01); *G06F 11/0751* (2013.01); *G06F 11/0781* (2013.01); *G06F 11/0793* (2013.01); *G06F 11/106* (2013.01); *G11C 29/52* (2013.01); *G11C 2029/0409* (2013.01); *G11C 2029/0411* (2013.01)

(58) Field of Classification Search
CPC .................................................. H04L 1/0045
USPC ........................................ 714/746, 704, 179
See application file for complete search history.

(56) References Cited

U.S. PATENT DOCUMENTS

| 7,864,588 B2* | 1/2011 | Betser | G11C 16/0475 |
| | | | 365/185.2 |
| 2005/0169083 A1* | 8/2005 | Riho | G06F 11/1004 |
| | | | 365/222 |
| 2008/0111182 A1* | 5/2008 | Irani | H01L 21/76897 |
| | | | 257/324 |
| 2009/0150595 A1* | 6/2009 | Lavan | G11C 16/0475 |
| | | | 711/103 |

(Continued)

OTHER PUBLICATIONS

Altera Application Note 357, "Error Detection and Recovery using CRC in Altera FPGA Devices" Jul. 2008, Version 1.4, 17 pages, retrieved from the Internet: <https://www.altera.com/content/dam/altera-www/global/en_US/pdfs/literature/an/an539.pdf>.

(Continued)

*Primary Examiner* — Fritz Alphonse

(57) ABSTRACT

An integrated circuit may include a plurality of configuration random access memory (CRAM) sectors that configure logic sectors to perform user-defined functions. The logic circuits configured by the CRAM sectors may vary in their criticality to the operation of the integrated circuit. A prioritized error detection schedule may be provided to error detection circuitry, allowing a more frequent check of sectors that are used to configure logical circuitry that is critical to the operation of the integrated circuit. Upon detecting an error in a given CRAM sector, a sensitivity map may be used to determine the logical location corresponding to the errant CRAM sector. A sensitivity processor may assign a criticality level to the logical location, and appropriate corrective action for the errant CRAM sector may be determined based on the criticality level and the logical location corresponding to the sector.

17 Claims, 13 Drawing Sheets

(56) References Cited

U.S. PATENT DOCUMENTS

| | | | | |
|---|---|---|---|---|
| 2010/0235831 | A1* | 9/2010 | Dittmer | G06F 9/45558 718/1 |
| 2014/0201579 | A1* | 7/2014 | Arsovski | G11C 29/56 714/719 |
| 2016/0049941 | A1 | 2/2016 | How et al. | |

OTHER PUBLICATIONS

Altera Application Note 539, "Test Methodology of Error Detection and Recovery Using CRC in Altera FPGA Devices" Aug. 3, 2016, 22 pages, retrieved from the Internet: <https://www.altera.com/content/dam/altera-www/global/en_US/pdfs/literature/an/an539.pdf>.

"Altera Error Message Register Unloader IP Core User Guide" May 2, 2016, 13 pages, retrieved from the Internet: <https://www.altera.com/en_US/pdfs/literature/ug/ug_emr_unloader.pdf>.

Welter, "Demonstration of Soft Error Mitigation IP and Partial Reconfiguration Capability on Monolithic Devices" Application Note: Kintex UltraScale FPGA, Xilinix, XAPP1261, Jun. 19, 2015, vol. 1.0, 36 pages, SEM website and Xapp1261 demo, retrieved from the Internet: <http://www.xilinx.com/support/documentation/application_notes/xapp1261-demo-sem-pr.pdf>.

Quartus Handbook "Design and Syntheses", vol. 1, Chapter 15, "Mitigating Single Event Upsets", Jun. 30, 2014, pp. 883-890, Altera Corporation, retrieved from the Internet: <https://www.altera.com/en_US/pdfs/literature/ug/ug_altadvseu.pdf>.

Altera, "Advanced SEU Detection IP Core Users Guide", Oct. 31, 2016, 26 pages, retrieved from the Internet: <https://www.altera.com/en_US/pdfs/literature/ug/ug_altadvseu.pdf>.

Morgan et. al., "SEU-Induced Persistent Error Propagation in FPGAs", IEEE Trans. Nuclear Science, vol. 52, No. 6, Dec. 2005.

Le, "Soft Error Mitigation Using Prioritized Essential Bits", Application Note: Virtex-6 and 7 Series FPGAs, Xilinx, XAPP538, vol. 1.0, Apr. 4, 2012, 11 pages, retrieved from the Internet: <http://www.xilinx.com/support/documentation/application_notes/xapp538-soft-error-mitigation-essential-bits.pdf>.

"LogiCORE IP Soft Error Mitigation Controller" User Guide, Xilinx, UG764, Oct. 1, 2011, 104 pages, retrieved from the Internet: http://www.xilinx.com/support/documentation/ip_documentation/sem/v3_1/ug764_sem.pdf.

A. Silburt, A. Evans, A. Burghelea, S. Wen, D. Ward, R. Norrish and D. Hogle, "Specification and Verification of Soft Error Performance in Reliable Internet Core Routers", in IEEE Trans Nuclear Science, vol. 55, No. 4, Aug. 2008.

B. Pratt, et. al., "Fine-Grain SEU Mitigation for FPGAs using Partial TMR", in Proc. IEEE Trans on Nuclear Science, vol. 55, No. 4, 2008.

Atsatt et al., U.S. Appl. No. 15/338,074, filed Oct. 28, 2016.

* cited by examiner

| SECTOR | SMH LOOKUP RESULT | CRITICALITY LEVEL | CORRECTIVE ACTION |
|---|---|---|---|
| $W_i$ | $X_i$ | $Y_i$ | $Z_i$ |
| 1 | CONTROL CIRCUITRY | HIGH | FRAME REWRITE/ PARTIAL RE-CONFIGURATION |
| ... | ... | ... | ... |
| 1001 | DATAPATH/ ACCELERATOR CIRCUITRY | MEDIUM | WAIT OR PARTIAL RECONFIG |
| ... | ... | ... | ... |
| 2001 | STATISTICS/ MONITORING CIRCUITRY | LOW | RESET STATS/ REGISTERS |

FIG. 11

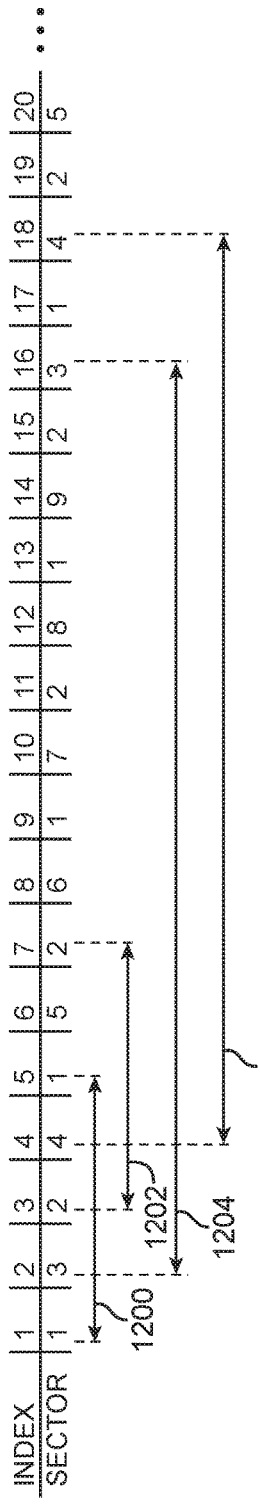
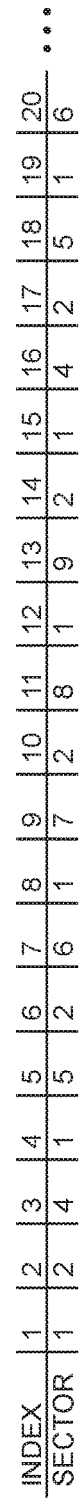
FIG. 12
FIG. 13
FIG. 14

PRIORITIZED ERROR-DETECTION AND SCHEDULING

BACKGROUND

This invention relates to devices and methods for performing prioritized error-detection for integrated circuits having memory, and more particularly, to integrated circuits having configuration random access memory that is partitioned into sectors.

Programmable integrated circuits are a type of integrated circuit that can be programmed by a user to implement a desired custom logic function. Logic functions implemented on a programmable integrated circuit may be used to perform a variety of tasks that have varying degrees of criticality or importance to the overall functioning of the integrated circuit. For example, some logic functions can be responsible for the control of peripheral circuitry while other logic functions can be responsible for the supervision or orchestration of subordinate logic circuits.

Configuration random access memory (CRAM) in the programmable integrated circuit refers to memory cells designated for storing configuration data to implement user logic functions. Logical values stored in the CRAM are applied to circuits in the programmable integrated circuit that perform different functions within the device. These different functions may have respective levels of criticality. Consequently, the CRAM cells used to program these circuits may have different respective levels of criticality to the functioning of the programmable integrated circuit device.

Conventional programmable circuits scan CRAM cells for errors uniformly, checking each cell within the CRAM for errors with a common frequency or at a single rate. The number of CRAM cells that can be checked for errors is limited by the rate at which the CRAM cells can be read. The number of CRAM cells that can be read simultaneously is limited, for example, by the power delivery circuitry to the programmable integrated circuit, the amount of silicon area (or, die area) allocated to the CRAM cells and the power delivery circuitry, and/or the amount of metal interconnection layer use allocated to the CRAM cells and the power delivery circuitry. Specifically, reading a number of CRAM cells in excess of a threshold number of CRAM cells will result in voltage dips on shared power rails servicing the CRAM cells, causing the programmable integrated circuit to fall out of an acceptable or usable operating range/specification.

CRAM cells are susceptible to single event upsets (SEUs) that cause bit-flips in the CRAM cells. SEUs are sometimes referred to as "soft errors" because they are not permanent faults (or, "hard" errors) and can be reversed (by rewriting a correct value into the affected memory cell). When one or more CRAM cells experience bit-flips due to SEUs, the errors in the CRAM can become harder to detect and correct. Moreover, the longer a system takes to detect and correct a SEU, the likelihood of the error adversely affecting system operation or leading to faulty/erroneous operation of device resources increases. For this reason, it is desirable to perform error detection operations on CRAM arrays frequently.

However, in conventional CRAM arrays, the error detection frequency of any single CRAM cell is limited by the size of the array and the capabilities of the power supply used to operate the programmable integrated circuit. Specifically, conventional CRAM arrays undergo error detection in a uniform manner, with each CRAM cell being checked for errors at a common frequency. As an example, if a programmable integrated circuit has the ability to detect errors in a row of CRAM bits at a time, if it takes 100 nanoseconds (ns) to check each row, and if a CRAM array has 100,000 rows, then each bit in the CRAM array will be checked every 10 million ns or 10 milliseconds (ms) in a conventional arrangement.

In certain applications, however, an error in CRAM cells that configure critical logic functions that persists for over 5 ms, 2 ms, or even 1 ms may result in unacceptable performance degradation or even failure.

Therefore, improved methods for providing error detection capabilities to integrated circuits with arrays of memory cells are required.

SUMMARY

A prioritized error schedule may be used by a device manager to perform prioritized error detection on configuration random access memory (CRAM) cells in an integrated circuit. An integrated circuit with an array of CRAM cells may be partitioned into sectors, each of which is provided with a local system manager that may be implemented using a state machine, a conventional processor, or any other suitable logic circuitry. The local system manager of each sector of CRAM cells may receive a respective control from the device manager that can be used to command the local system manager to perform error detection on its respective sector of CRAM cells.

The order in which the local system managers are commanded to perform error detection is prescribed by a prioritized error detection schedule. In the prioritized error detection schedule, certain sectors associated with circuitry having a higher criticality to the operation of the integrated circuit may be prescribed a higher frequency of error detection relative to relatively less critical circuitry. Circuitry that is highly critical to the operation of the integrated circuit may have a relatively lower frequency of error detection if said critical circuitry is provided with internal error detection circuitry such as multi-mode redundancy check circuitry.

Upon detecting an error in any of the sectors, the secure device manager may receive a notification indicating the sector in which the error was detected. A lookup may be performed to determine the logical location associated with the physical location of the error (i.e., the logical circuitry or device resource group type configured by the physical CRAM cell), the criticality level of the determined logical location, and/or corrective action associated with the determined logical location with the determined criticality level. Errors associated with a first device resource group may have a first corrective action that is different from a second corrective action that is associated with a second device resource group.

Activation and deactivation of logical circuitry on the integrated circuit may trigger modifications to the prioritized error detection schedule. Activation of logical circuitry may result in the addition of error detection prescriptions in the prioritized error detection schedule for CRAM cells used to configure the activated logical circuitry at a frequency that is based on the criticality of the activated circuitry to the operation of the integrated circuit. Deactivation of logical circuitry may result in the deletion of error detection prescriptions from the prioritized error detection schedule for CRAM cells used to configure the deactivated logical circuitry.

BRIEF DESCRIPTION OF THE DRAWINGS

FIG. 11 is a chart of exemplary sensitivity map header (SMH) look up values, criticality level lookup values, and corrective action lookup values for exemplary sectors in accordance with an embodiment.

FIG. 12 is an exemplary prioritized error detection schedule for nine sectors in accordance with an embodiment.

FIG. 13 is an exemplary prioritized error detection schedule for eight sectors in accordance with an embodiment.

FIG. 14 is an exemplary prioritized error detection schedule with periodic maintenance modes for critical memory sectors in accordance with an embodiment.

DETAILED DESCRIPTION

Embodiments of the present invention relate to error detection circuitry and control circuitry and methods for error detection circuitry provided to random access memory (RAM) cells in a integrated circuit (specifically, configuration RAM or CRAM). The integrated circuit may implement various user logic functions in programmable logic fabric, or may include hardened circuitry (examples of hardened circuitry include IP blocks) that is relatively less programmable than the logic fabric to implement other logic functions.

In some scenarios, a first CRAM cell can provide a configuration bit to circuitry that is critical to the operation of the integrated circuit and a second CRAM cell can provide another configuration bit to circuitry that is not as critical (or that is not critical) to the operation of the integrated circuit. In such scenarios, it may be desirable to check the first CRAM cell for errors more frequently than the second CRAM cell.

As an example, an integrated circuit such as a programmable integrated circuit may be partitioned into multiple sections or sectors. A respective partition or sub-array of the array of CRAM cells on the integrated circuit may be contained within each of the sectors of the integrated circuit. Each of the partitioned sections or sectors of the integrated circuit may include a respective partition or sub-array of the array of CRAM cells. These sub-arrays may be individually referred to as CRAM sectors. This is merely illustrative and does not serve to limit the scope of the present invention. If desired, application specific integrated circuits, microprocessors, and other application specific products having a CRAM array may be divided into multiple sections or sectors that each contain a respective sub-array of the CRAM array.

Figure 1:
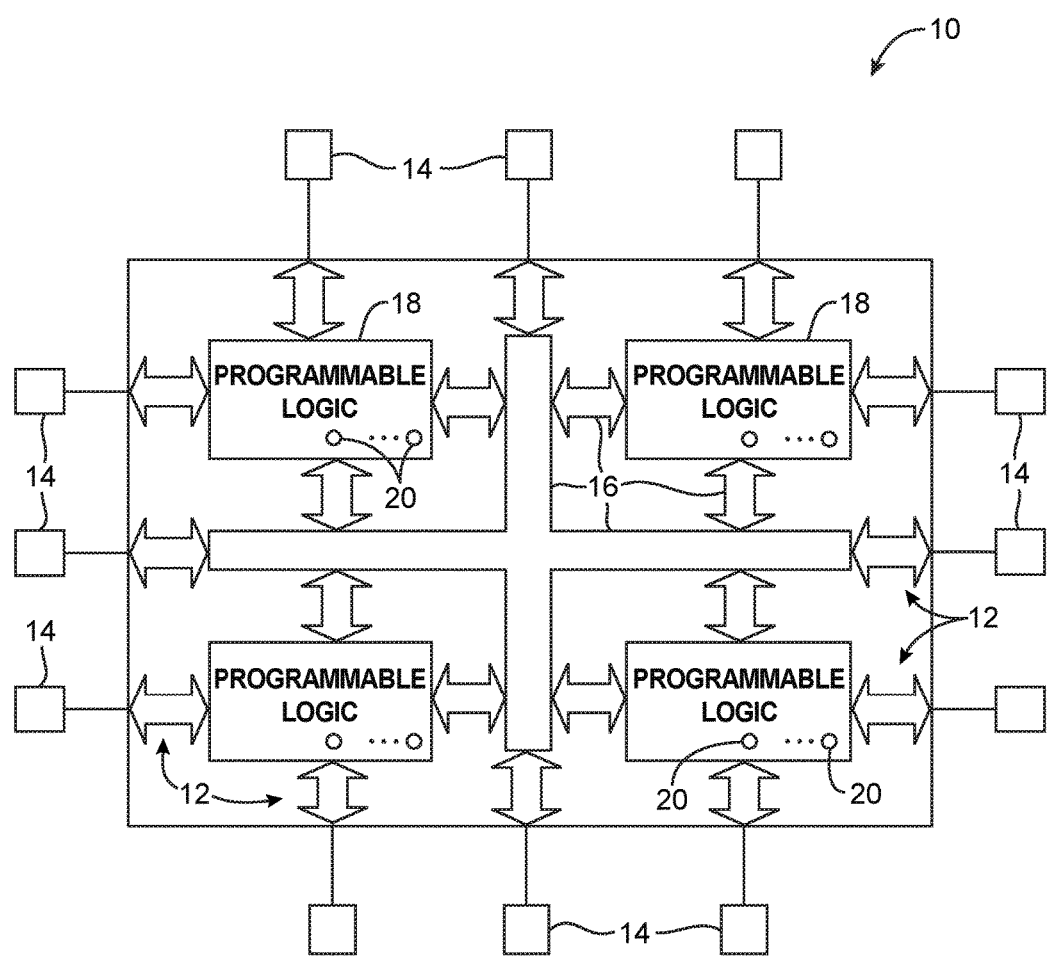
FIG. 1 is a diagram of an illustrative programmable integrated circuit that implements custom logic functions based on configuration random access memory (CRAM) settings in accordance with an embodiment.

FIG. 1 is a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. Programmable logic 18 may also include embedded RAM blocks of varying sizes, embedded ASIC blocks such as programmable multipliers, arithmetic blocks or video processing, and embedded processors. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM). Programmable element 20 may be used to provide a static control output signal for controlling the state of an associated logic component in programmable logic 18. The output signals generated by elements 20 are often applied to gates of metal-oxide-semiconductor (MOS) transistors (sometimes referred to as pass gate transistors). This example is merely illustrative. If desired, programmable elements 20 may be used to provide static output signals for configuring any desired circuitry on device 10.

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
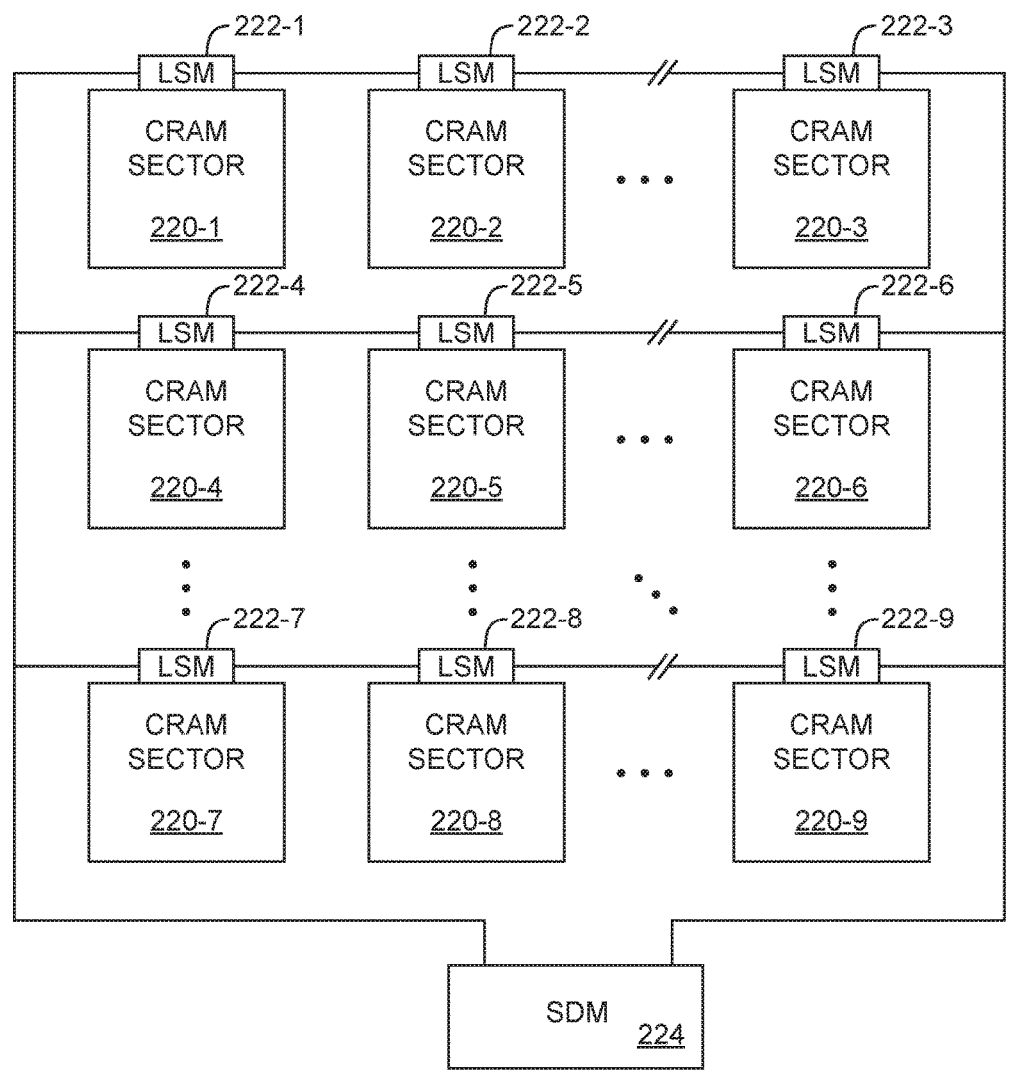
FIG. 2 is a diagram of a field programmable gate array (FPGA) and its associated CRAM array partitioned into sectors in accordance with an embodiment.

FIG. 2 illustrates an array of the programmable elements 20 that may be arranged in smaller sub-arrays of independently addressable and independently readable sectors. In the illustration of FIG. 2, it may be assumed that the programmable elements 20 are all configuration RAM (i.e., CRAM) cells. An array of CRAM cells may include elements 20 that are used to configure circuitry in the control or orchestration circuitry of an integrated circuit that is critical to proper operation of the integrated circuit, and may also include elements 20 that are used to configure circuitry in datapath circuitry that is less critical to proper functioning integrated circuit.

To simplify the explanation of the present invention, it will be assumed, for the sake of argument, that programmable elements 20 that are related to configuration of circuitry of a given criticality level (e.g., high criticality, medium criticality, or low criticality) are contained within sectors. In other words, any given sector will be assumed to not contain CRAM cells (i.e., programmable elements 20 used as CRAM bits) that include both high criticality and low criticality bits, but will instead have bits of only a single given criticality level. However, this does not limit the scope of the present invention. Individual sectors can include CRAM bits of mixed criticality levels without exceeding the scope of the present invention. When sectors include CRAM bits of mixed criticality levels, it may be assumed that the sector has a criticality level equal to the highest criticality level of its constituent CRAM bits. For example, if a sector includes low criticality and medium criticality CRAM bits, the sector may be considered a medium criticality sector.

An array of programmable elements 20 of FIG. 1 used as CRAM cells may be partitioned into a number of CRAM sub-arrays referred to as sectors. CRAM sectors 220 may each be coupled to an associated local sector manager (LSM) circuit 222. Specifically, sectors 220-1, 220-2, 220-3, 220-4, 200-4, 220-5, 220-6, 220-7, 220-8, and 220-9 may be coupled to LSMs 222-1, 222-2, 222-3, 222-4, 222-5, 222-6, 222-7, 222-8, and 222-9, respectively. LSMs 222 may be implemented using processing circuitry, state machines, or any other suitable logic circuitry. While the simplified illustration of sectors in FIG. 2 shows nine sectors 220 and nine associated LSM circuits 222, it will be appreciated by a person of ordinary skill in the art that the numbers of sectors may change according to the number of CRAM cells used or required by an integrated circuit and the size of the sub-arrays that the CRAM cells are partitioned into.

A number of factors may affect the best size or sizes for the sectors. A smaller sector may be assembled more rapidly with the containing array requiring the same time for its own assembly. However, a larger sector may more easily contain the desired ratio of FPGA component types, as determined by customer preferences, but this better match may be more difficult to re-use for different ratios as needed by other devices in one FPGA product family.

Additionally, sectors are not the only large blocks in the top-level FPGA design. High-Speed Serial Interface (HSSI) packs, which include packs of high speed serial transceivers, and multiple-conventional-I/O I/O blocks are other large blocks in the top-level FPGA design. It may be advantageous for the chip assembly process if HSSI packs, I/O blocks, and sectors all had the same height, as this "pitch-matching" may make the full chip easier to assemble from them (i.e., the size of HSSI packs and I/O blocks may also determine the size of the sectors 220). This arrangement may be advantageously extended to other large blocks that may be included in the full chip, such as optional processors and other suitable large blocks.

The simplified illustration of FIG. 2 also omits, so as to avoid obscuring the present invention, unidirectional interconnects between different LSM circuits 222 and the between LSM circuits 222 and the secure device manager (SDM) 224 in favor of simplified bi-directional interconnects between these circuits. In large-scale implementations of multiple sectors, zipper circuitry may be used to transmit data between the LSM circuits 222 vertically along a given column of the CRAM array, and sub-system manager circuitry may be used to transmit data between the LSM circuits 22 horizontally across a given row of the CRAM array. For CRAM arrays having a size greater than a threshold size, the CRAM arrays may be partitioned into two or more sets of columns, and universal interface blocks (UIBs) may be used to receive and transmit data from different sets of columns to the SDM 224.

The connections between the SDM 224 and the LSMs 222 is discussed in greater detail in connection with FIG. 10. Generally, the connections between the SDM 224 and the LSMs 222 are part of a configuration network on chip (CNoC). SDM 224 may be responsible for fulfilling an error detection schedule for the sectors 220.

In conventional error detection schemes, the SDM 224 may uniformly traverse the sectors 220 while performing error detection. As an example, if the error detection capabilities of an integrated circuit permit three sectors to be checked for errors simultaneously (this number being limited by the power delivery capabilities of the power supply provided to the integrated circuit) and the time for error detection on a sector can be performed in 1 millisecond (this number being limited by the read speed of the memory cells in the CRAM sectors 220 and the system voltage on the integrated circuit), a conventional error detection scheme may involve the SDM signaling the LSMs 222-1, 222-2, and 222-3 to perform error detection on their respective sectors (i.e., sectors 220-1, 220-2, and 220-3) at a first time, signaling the LSMs 222-4, 222-5, and 222-6 to perform error detection on their respective sectors (i.e., sectors 220-4, 220-5, and 220-6) at a second time that is 1 ms after the first time, and signaling the LSMs 222-7, 222-8, and 222-9 to perform error detection on their respective sectors (i.e., sectors 220-7, 220-8, and 220-9) at a third time that is 1 ms after the second time.

In this way, a conventional scheme for detecting errors in a sector-partitioned CRAM array may have an associated "frame time" or a time required to perform error detection on all of the sectors in a CRAM array. In the above example, the "frame time" would be 3 ms because three rows are checked and each error detection operation on the row takes 1 ms. The frequency that any sector is checked for errors is, in the conventional scheme, the inverse of the frame time. Because a given sector (such as sector 220-1) is checked once per frame time, the frequency of error detection for any given second is one divided by the frame time. In the above example where the frame time of error detection is 3 ms, the frequency for error detection for any given sector is once every 3 ms (or approximately 333 times per second).

LSMs 222 may include error detection and correction circuitry. Including error detection and correction circuitry in the LSMs 222 may allow for error detection to occur in parallel for multiple sectors. Error correction may also occur in parallel for multiple sectors. In devices that support partial reconfiguration, error correction circuitry in a LSM 222 may solve for the flipped bit (i.e., the bit in the associated CRAM sector 220 that was detected to be erroneous) and apply a scrubbed bitstream back to the sector 220 via partial reconfiguration, thereby supporting parallel scrubbing across the sectors 220 (since each sector 220 has a respective LSM 222 with error correction circuitry).

The localization of the error detection and correction by having an LSM 222 with error detection and correction circuitry coupled to each sector 220 reduces the total distance travelled by the configuration to the data register or CRAM bit/cell (hence, the capacitance and power consumption), allows for direct computation of the location of the error (localized to the sector), and allows for scrubbing to occur at the local level, further reducing data transport and power consumption.

The sectors 220 may include CRAM cells used to configure various logical circuitry in an integrated circuit. In the example of a programmable integrated circuit, a first column of sectors (such as the column of sectors 220-1, 220-4, and 220-7) may have CRAM cells used for configuring control circuitry in the programmable integrated circuit that supervises the functioning of computation or datapath circuitry. The computation or datapath circuitry may be configured using CRAM cells/bits in the remaining sectors of a CRAM array. Generally, control circuitry that is not provided with any redundancy or self-checking mechanisms is considered to be the most critical circuitry on a programmable integrated circuit or at least more critical relative to datapath or computation circuitry.

In many systems, certain portions of the design are more critical than others. Though a single error upset (SEU—a "soft" error) is equally likely to affect in equally sized areas (i.e., equally sized sub-arrays or sectors of a CRAM array), an SEU has greater system impact when it occurs in portions of the CRAM array that sets configuration bits for critical circuitry or logic circuits. For example, in a wireline bridge an error in the control-plane logic may cause erroneous classification and processing of all packets or latching of incorrect router configuration, while an error in the data payload may result in a transient error to a packet that is caught by a higher-level protocol such as a later CRC check. In such an arrangement, the control-plane logic may be considered more critical than the data payload. Consequently, it would be desirable to check for errors in the CRAM sector that configures the control-plane logic more frequently than the CRAM sector that configures logic circuitry in the data payload.

In order to specify its function, each functional block in a programmable integrated circuit may be associated with or provided CRAM bits. These bits may supply constant values to the logic, thereby configuring the logic's functions.

Figure 3:
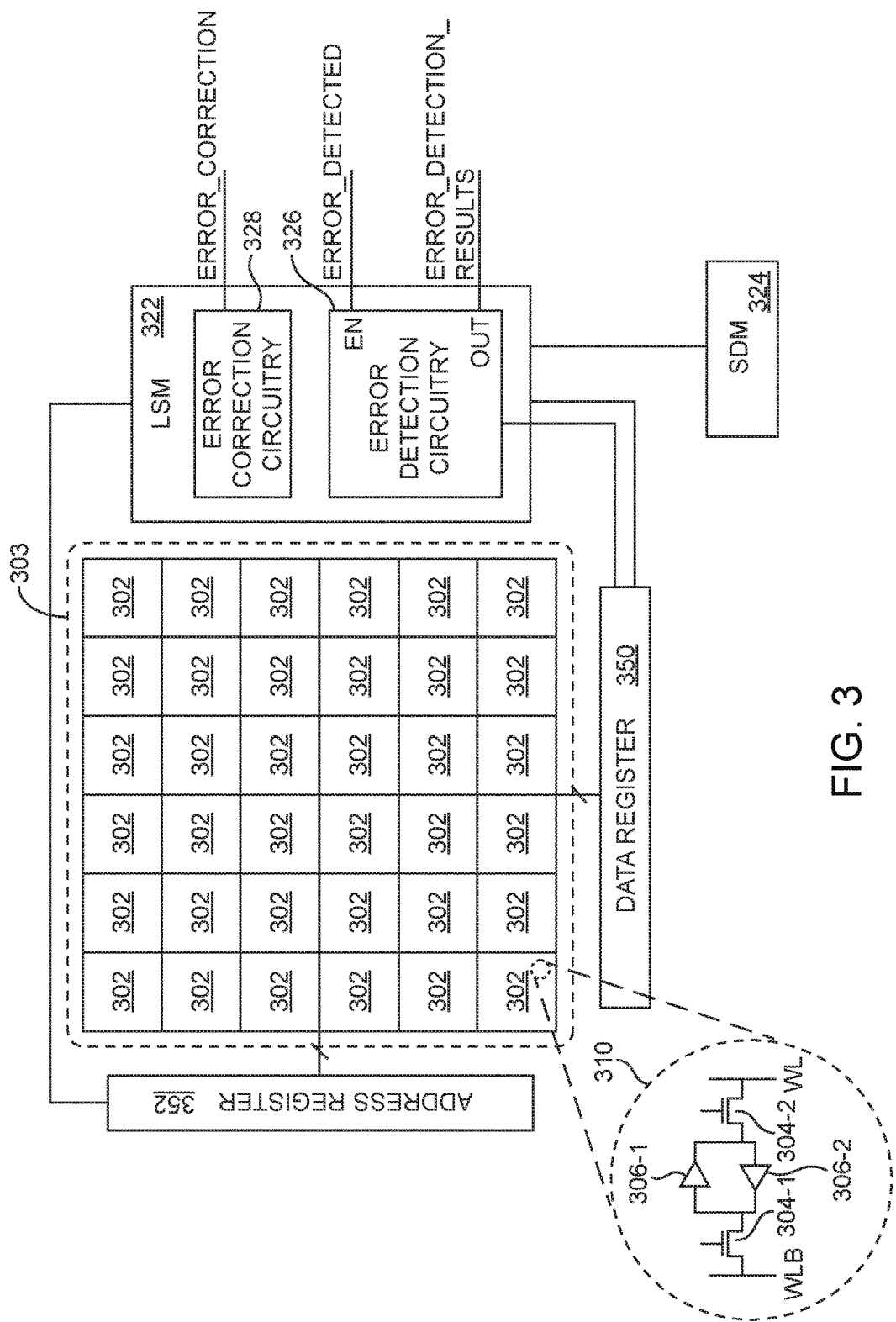
FIG. 3 is a diagram of an individual CRAM sector associated with an FPGA and addressing circuitry for the CRAM sector in accordance with an embodiment.

FIG. 3 shows logic supporting the CRAM sectors 220 of FIG. 2. Data register 350 and address register 352 may be used on power-up to accept a bitstream through a dedicated configuration port and write the configuration bitstream to the CRAM bits in a particular sector. As shown in FIG. 3, a CRAM sector 303 may include a sub-array of CRAM cells 302. Within each CRAM cell 302, a bistable storage element 310 (similar to the programmable elements 20 of FIG. 1) may be used to store a configuration bit. The bistable element 310 and the programmable elements 20 may be volatile random access memory (RAM) with two states—a logical zero and a logical one. Two inverter circuits 306-1 and 306-2 may be cross-coupled to form such a bistable element that is coupled between wordline WL and an inverse wordline WLB. Access transistors 304-1 and 304-2 may couple the bistable elements to the respective lines WLB and WL.

The data register 350 and address register 352 may also be used to detect and correct errors in a CRAM sector 303, or in portions thereof. Specifically, during error detection operations, the address register may be instructed by the LSM 322 to activate the access transistors 304 in a row of CRAM cells 302 to read out the value stored by the bistable element formed from inverters 306 to the wordlines WL and WLB. The data from the wordlines WL and WLB may be received at the data register 350 that is coupled to local error detection circuitry 326 in the LSM 322. At the error detection circuitry 326, error correction operations (such as cyclic redundancy check—CRC) may be performed on the data received from the data register.

During error correction operations, a frame of data in a CRAM sector 303 or a row of data in a CRAM sector 303 may be activated using the address register 352 (i.e., the access transistors 304 may be turned on by the address register) and data from the data register 350 may be loaded into the activated CRAM cells 302. Corrected data may be provided to the data register 350 by local error correction circuitry 328 in the LSM 322. The error detection and correction operations on a given sector 303 may be triggered or orchestrated by a command produced by the SDM 324 (similar to the SDM 224 of FIG. 2). The connections between SDM circuitry and the LSMs of the various CRAM sectors are described in detail in connection with FIG. 10.

Figure 4A:
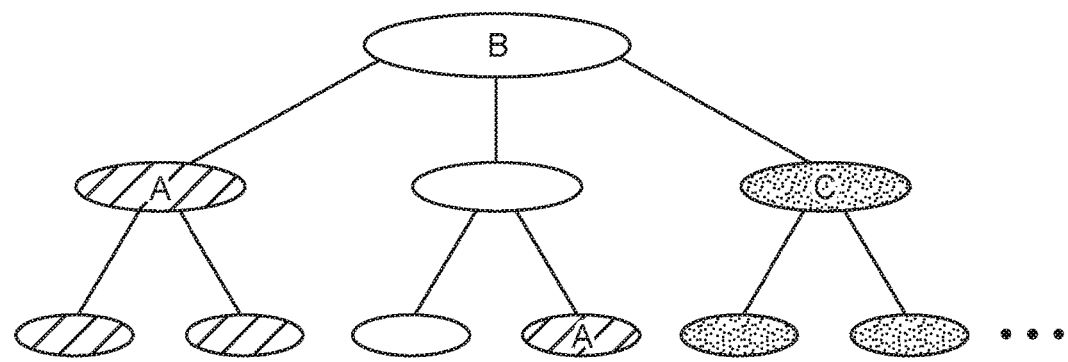
FIG. 4A is a diagram of an illustrative design hierarchy with different sensitivity regions in accordance with an embodiment of the present invention.

When the logic resources on a programmable integrated circuit 10 are configured to implement a user-defined logic function, the logic resources can be organized in different logical "partitions." The various logical partitions can be arranged according to a logic design hierarchy. FIG. 4A is a diagram of an exemplary logic design hierarchy having at least ten logical partitions. Partitions in the upper portions of the logic design hierarchy represent partitions related to the overall functionality of the logic design, whereas partitions in the lower portions of the logic design hierarchy represent partitions related to more specific attributes of the logic design.

The hierarchy of FIG. 4A includes three types of logical partitions. A first group of logical partitions (e.g., partitions labeled as "A") may be assigned a first sensitivity tag (or, criticality level) in a sensitivity map header (SMH) file. A second group of logical partitions (e.g., partitions labeled as "B") may be assigned a second sensitivity tag (or criticality level) in a sensitivity map header (SMH), where the second tag that is different from the first tag. A third group of logical partitions (e.g., partitions labeled as "C") may be assigned a third sensitivity tag (or criticality level) that is different from the first and second tags. Portions of the logic hierarchy that does not have an explicitly assigned sensitivity tag may be handled according to the sensitivity tag that is assigned to its parent partition in the hierarchy. The type of sensitivity tag that is assigned to each logical partition may be selected manually by the user or may be automatically set using computer-aided design tools. Devices resources that are not being used to implement the custom logic function are not part of any design partition and is therefore excluded from the design hierarchy (i.e., each partition in the logic design hierarchy only includes bits that are in use by the current logic function).

In an embodiment of the present invention, the user may be given an opportunity to perform "hierarchy tagging," a capability that allows the user to tag only selected partitions of the overall design hierarchy as critical for device operation. Partitions having the same sensitivity tag (or region tag) may be considered as part of one sensitivity region. The sensitivity tag is therefore sometimes considered a region identifier.

In the example of FIG. 4A, there may be a first sensitivity region that includes all logical partitions with tag A, a second sensitivity region that includes all logical partitions with tag B, and a third sensitivity region that includes all logical partitions with tag C. Each sensitivity region may require a corresponding corrective action. When an SEU occurs in the first sensitivity region, a first corrective action may be triggered. When an SEU occurs in the second sensitivity region, a second corrective action may be triggered. When an SEU occurs in the third sensitivity region, a third corrective action may be triggered. If desired, one or more of the sensitivity regions need not trigger any corrective action (i.e., at least one of the sensitivity regions include logical partitions having bits that are not critical). The example of FIG. 4A is merely illustrative. In general, the logic circuitry on device 10 may be organized into any suitable number of sensitivity regions.

Figure 4B:
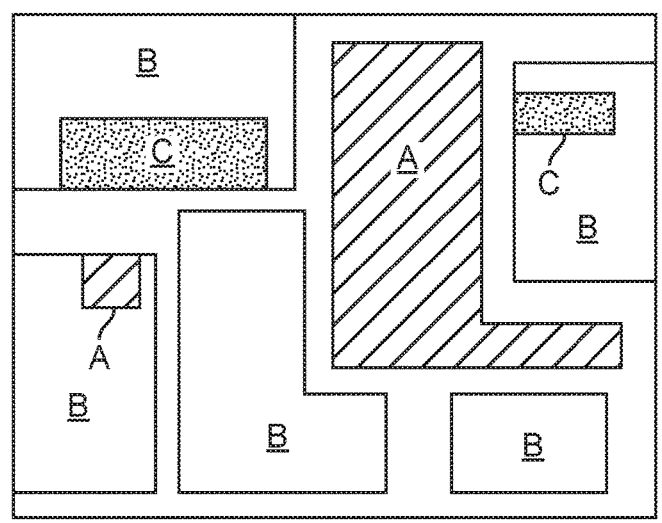
FIG. 4B is a diagram of an illustrative design hierarchy sensitivity map in accordance with an embodiment of the present invention.

FIG. 4B is a diagram illustrating how device resources types (i.e., logical partitions) on integrated circuit 10 can be grouped into different sensitivity regions. One can think of FIG. 4B as a physical representation of the logic shown in FIG. 4A. As shown in FIG. 4B, device logic resources (e.g., CRAM memory elements) on device 10 may be organized into separate partitions. Resources that are not part of any logical partition (see, e.g., region 250 in FIG. 6) are not being used to implement this particular design. Because CRAM bits that are located in region 250 are not used in the design at all, these bits may be assigned a sensitivity tag of zero, which forces these bits to be completely excluded from the sensitivity mapping.

In the example of FIG. 4B, logical partitions that are assigned a sensitivity tag A collectively form a first sensitivity region, partitions that are assigned a sensitivity tag B collectively form a second sensitivity region, and partitions that are assigned a sensitivity tag C collectively form a third sensitivity region. The ability to assign various non-zero sensitivity values to different sensitivity regions that are in use by the design allows the system to potentially ignore non-critical errors or to handle less critical errors without interrupting system operation, which can significantly reduce the design effective failure in time (FIT) rate.

Figure 5:
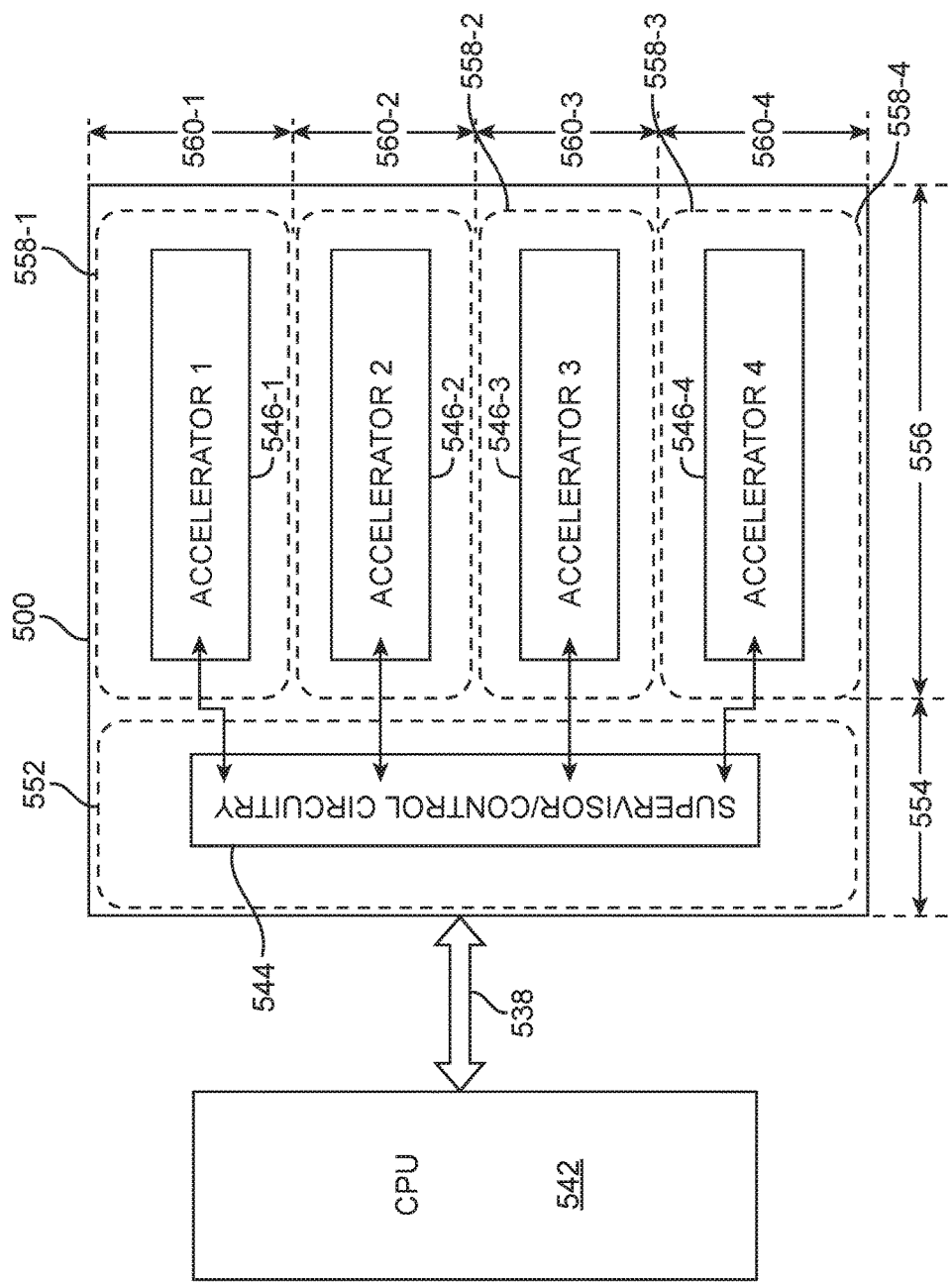
FIG. 5 is a diagram of an exemplary hardware accelerator system with regions of varied sensitivity in accordance with an embodiment.

FIG. 5, like FIG. 4B, shows different device resource groupings on an integrated circuit 500. Integrated circuit 500 may be a computing acceleration system that is coupled via a communications link (such as a PCI Express link) 538 to a CPU 542. In many compute-acceleration systems such as the example of FIG. 5, logic is divided into the shell region 552 containing CRAM bits that configure supervisor or control circuitry 544 that communicates with a host processor (such as CPU 542) or other compute system and one or more accelerator logic regions 558 that include hardware accelerators 546 that perform compute-acceleration functions for the CPU 542. Accelerator logic regions 558-1, 558-2, 558-3, and 558-4 may contain CRAM bits that configure the hardware accelerators 546-1, 546-2, 546-3, and 546-4, respectively.

The control circuitry 544 may be configured by CRAM bits in the columns 544 of the integrated circuit 500, while the hardware accelerator circuitry 546 may be configured by CRAM bits in the columns 556. The accelerator logic regions 558-1, 558-2, 558-3, and 558-4 in columns 556 may be vertically contained in rows 560-1, 560-2, 560-3, and 560-4, respectively. An error in the control circuitry 544 is critical because it affects all designs and the fundamentals of the system on the integrated circuit 500. An error in any of the accelerator slots 546 may affect only one respective process, and could be repaired (i.e., returned to valid state) by a process-kill rather than a system-kill (or in other words, by corrective action that requires less downtime for the overall functioning of the integrated circuit 500).

A sensitivity map header (SMH) file for the integrated circuit 500 may provide a lookup from architectural location (LUT or routing mux) on the integrated circuit to the sensitivity or criticality tag of the module affected. More specifically, the SMH file may provide a look up or equivalency table between physical locations on the integrated circuit (such as a location of an erroneous bit in a CRAM sector) and a logical location (such as the logic function that is configured by a particular CRAM bit).

As an alternative to an SMH file look up to determine sensitivity of a given CRAM sector, a generic lookup file that simply maps any given CRAM sector (i.e., a physical location) to a particular device resource type or logical partition configured by the CRAM sector (i.e., a logical location) may be used. This generic lookup file may also have a sensitivity tags and corrective actions associated with the logical location corresponding to any given CRAM sector, thus obviating the need for additional sensitivity processing/lookups to determine the sensitivity of an error once the corresponding logical location of the error has been determined. For the purposes of illustrating the processes associated with determining the sensitivity and corrective actions associated with a CRAM sector affected by SEUs, the example of an SMH file lookup will be used. However, it can be appreciated that these steps that relate to or reference SMH files may be alternatively performed using generic lookups without all of the information provided by an SMH file or a single lookup.

As an example, if an erroneous bit is detected in a CRAM sector in accelerator region 552 that configures the supervisor circuitry 544, an SMH file may be used by the SDM 224 or even the local LSM 222 for the CRAM sector to determine that the erroneous CRAM bit is used to configure the supervisor circuitry 544. Based on this lookup of the logical circuitry that is configured by the erroneous CRAM bit, further lookup may be performed to determine the criticality level of the erroneous bit based on the logical circuitry it configures. A further level of lookup may involve determining the appropriate corrective action based on the logical circuitry configured by the erroneous bit and the criticality level of the erroneous bit. This lookup is described in detail in connection with FIG. 11.

Figure 6:
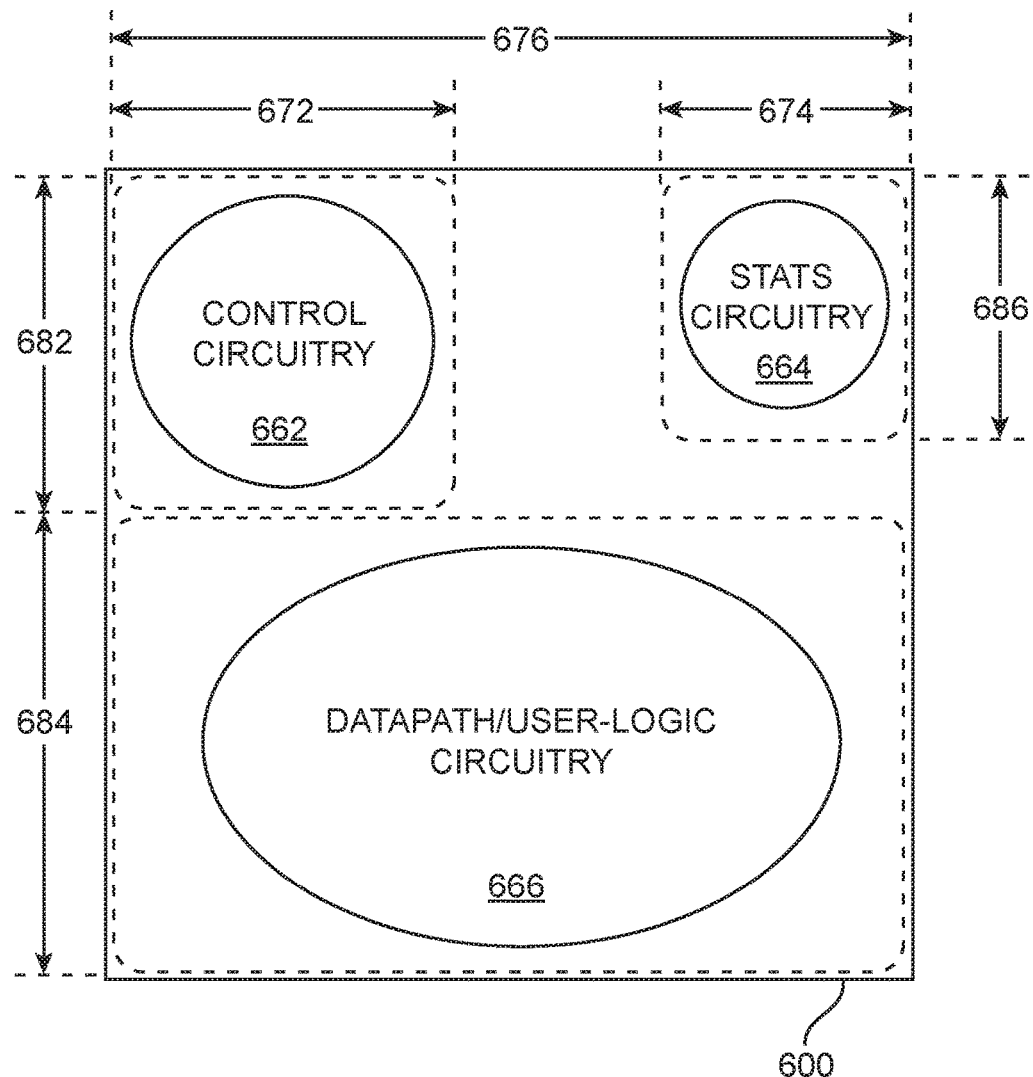
FIG. 6 is a diagram of an exemplary networking system with regions of varied sensitivity in accordance with an embodiment.

FIG. 6, like FIG. 5, illustrates different device resource groupings on an integrated circuit 600. In the example of FIG. 6, the logical circuits are grouped into more general groupings such as control circuitry 662 that is configured by CRAM sectors/bits in the region of circuit 600 bounded by columns 672 and rows 682, statistics circuitry 664 that is configured by CRAM sectors/bits in the region of circuit 600 bounded by columns 674 and rows 686, and datapath or user-logic circuitry 666 that is configured by CRAM sectors/bits in the region of circuit 600 bounded by columns 676 and 684.

When one or more CRAM bits in the rows 682 and columns 672 are discovered to be erroneous, a SMH lookup may indicate that the one or more CRAM bits correspond to the control circuitry 662 and may further indicate that the erroneous bits are critical to the operation of the integrated circuit 600 and therefore require immediate corrective action. This corrective action may be referred to as "scrubbing" in which a subset of CRAM bits (e.g., a row of CRAM data, a frame of CRAM data, a data word in the CRAM, or even an entire CRAM sector) containing the errant bit is re-written via partial reconfiguration of the CRAM array.

When one or more CRAM bits in the rows 686 and columns 674 are discovered to be erroneous, a SMH lookup may indicate that the one or more CRAM bits correspond to the statistics circuitry 664 and may further indicate that the erroneous bits are not as critical (i.e., have a medium or low criticality) to the operation of the integrated circuit 600 as the bits that configure the control circuitry 662, and therefore require limited corrective action. In the example of statistics circuitry, this corrective action may involve resetting the statistics recorded by the circuitry 664 without halting the operation of the control circuitry 662 or the datapath circuitry 666. Alternatively, an error in the CRAM cells configuring statistics circuitry 664 may be deemed (by the SMH lookup file) as an error that can be safely ignored.

When one or more CRAM bits in the rows 684 and columns 676 are discovered to be erroneous, a SMH lookup may indicate that the one or more CRAM bits correspond to the datapath and user-logic circuitry 666 and may further indicate that the erroneous bits are not as critical (i.e., have a medium or low criticality) to the operation of the integrated circuit 600 as the bits that configure the control circuitry 662, and therefore require limited corrective action. In the example of datapath or user-logic circuitry, this corrective action may involve ignoring the error due to downstream data-checks that will resolve or correct data that would be corrupted by the erroneous CRAM bit, or the corrective action may involve a partial reconfiguration when the datapath circuitry is under maintenance (i.e., during down-time), or the corrective action may involve an immediate scrubbing (or rewriting) of the errant bit through partial configuration. Alternatively, an error in the CRAM cells configuring user-logic circuitry 666 may be deemed (by the SMH lookup file) as an error that can be safely ignored.

Figure 7:
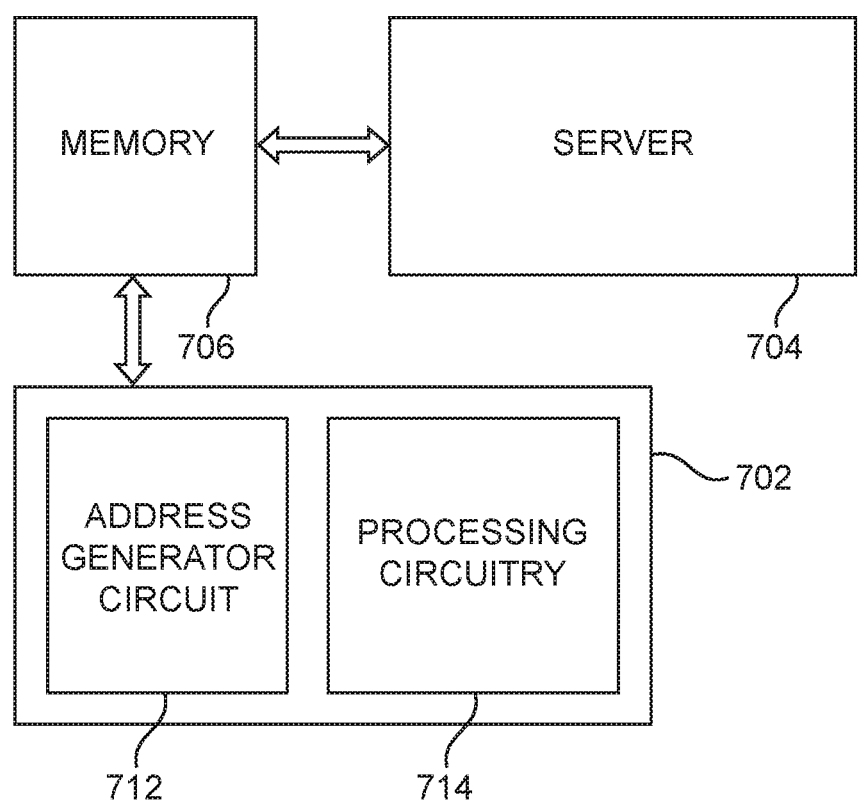
FIG. 7 is a diagram of an exemplary programmable integrated circuit that interfaces with memory using address generator circuitry in accordance with an embodiment.

FIG. 7 shows another example of device resource groupings on an integrated circuit 702. Integrated circuit 702 may be a programmable integrated circuit with processing circuitry 714 and address generator circuitry 712. The integrated 702 may interface with memory 706 that is shared with a server 704. The address generation logic in circuitry 712 may comprise only 1% of a design (in terms of the number of CRAM bits used to configure the circuitry 712) but allows a direct memory access (DMA) engine to write bad data to a shared memory (if the CRAM bits used to configure the circuitry 712 are corrupted).

According to an embodiment, the present invention would "guard" the address generation by delaying the commitment of data to a generated address until an error detection cycle on the CRAM sectors configuring the address generation circuitry 712 has been completed, but may speed up the error detection on sectors configuring the address generation circuitry cycle over the conventional method (of performing error detection on each of the sectors once per frame time) by checking the CRAM using prioritized error detection schedules.

It is often desirable to provide circuitry on an integrated circuit with error resiliency. For example, operational errors such as caused by transistor aging or SEUs (soft errors) may result in incorrect circuit functionality. To help provide error resiliency, circuitry is sometimes implemented using double modular or triple modular redundancy in which multiple copies of the circuitry are implemented.

Figure 8:
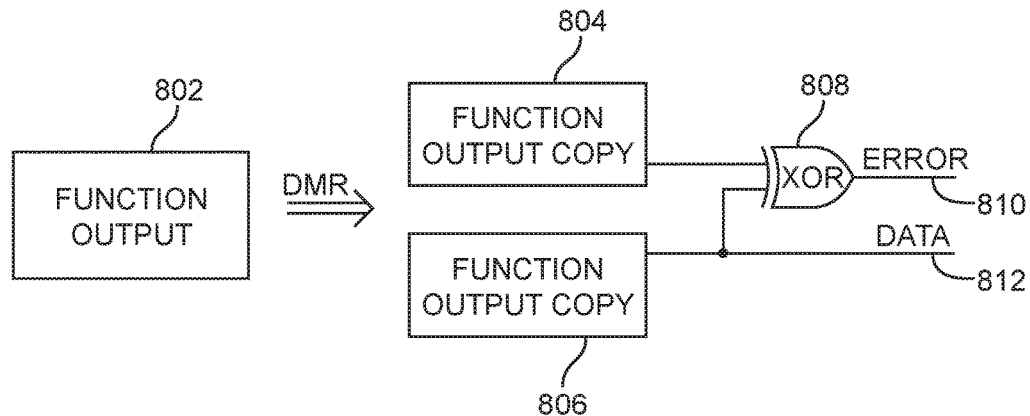
FIG. 8 is a diagram of an exemplary dual-modular redundancy (DMR) circuit in accordance with an embodiment.

FIG. 8 illustrates a double modular redundancy circuit that is capable of detecting. A double modular redundancy circuit such as the circuit of FIG. 8 merely detects the existence of errors but is not capable of correcting the detected errors. Some users may create multiple copies of a design and implement the multiple design copies in an integrated circuit together with a redundancy circuit. The output of the original design may be the function output 802 and the respective design copies may produce function output copies 804 and 806. The combination of using multiple copies 804 and 806 of the same design together with an XOR gate 808 may allow a user to detect whether or not an error is present in one of the function output copies 804 and 806, but does not allow the user to determine which of the copies 804 and 806 is erroneous.

As shown in TABLE 1 below, the output ERROR 810 of the XOR gate 808 and the output DATA 812 may be influenced by the states of the function output copies 804 and 806. Namely, when the copies 804 and 806 have differing values, the ERROR 810 signal output by XOR gate 808 may be asserted. A DATA 812 signal may be used to output the value of copy 806, although in an alternate embodiment, the output of copy 804 may be used as the output DATA 812 signal from the DMR circuitry of FIG. 8. Data that is output on line 812 while the ERROR 810 signal is asserted may either be discarded or be subject to additional error checking or verification.

TABLE 1

| COPY 804 | COPY 806 | ERROR 810 | DATA 812 |
|---|---|---|---|
| 0 | 0 | 0 | 0 |
| 0 | 1 | 1 | 1 |
| 1 | 0 | 1 | 0 |
| 1 | 1 | 0 | 1 |

Figure 9:
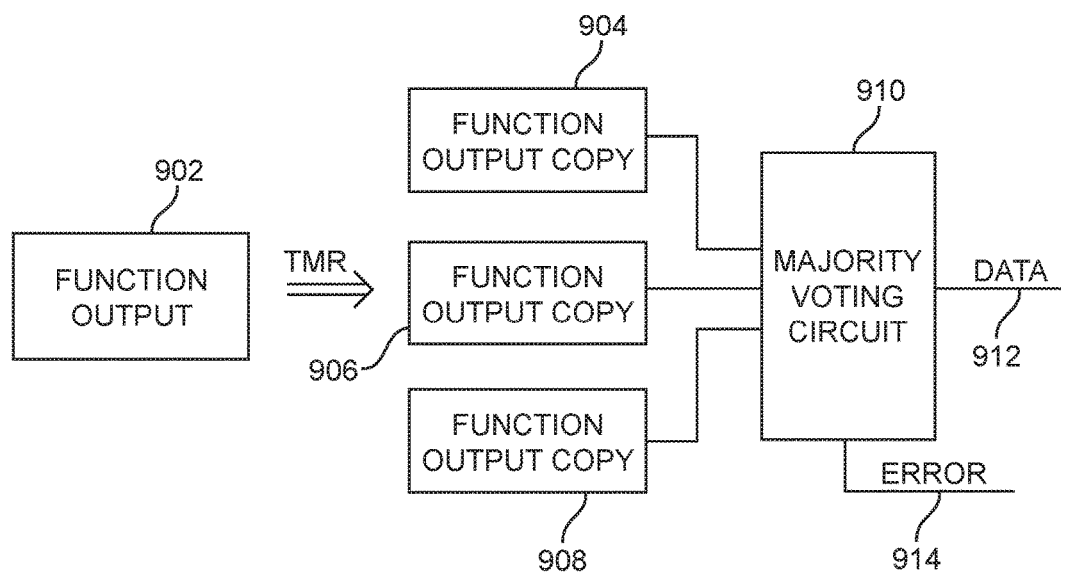
FIG. 9 is a diagram of an exemplary triple-modular redundancy (TMR) circuit in accordance with an embodiment.

Triple modular redundancy, as shown in FIG. 9, is capable of correcting detected errors, but is expensive and requires three times the circuit resources of arrangements in which no redundancy is used. As previously described, some users may create multiple copies of a common design (such as a design with the function output 902) and implement the multiple design copies (such as the copies 904, 906, and 908) in an integrated circuit. The combination of using multiple copies of a common design together with a majority vote circuit is sometimes referred to as multi-mode redundancy.

The triple modular redundancy circuitry of FIG. 9 may include three identical copies 904, 906, and 908 of a circuit output 902. All three copies may be produced by respective circuits that receive the same signals at the same inputs as the circuitry that produces output 902 and that independently produce a respective output signal. The three output signals 904, 906, and 908 may be provided to a majority voting circuit 910. Majority voting circuit 910 may implement a majority function and an error function in a first mode.

Similarly, an error may be detected when at least one of the copies 904, 906, and 908 produces a different output signal than the other two copies. In other words, an error may be detected when not all copies 904, 906, and 908 produce the same results. As shown in TABLE 2, an error signal 914 may be asserted when the copies do not all have the same value. A data signal 912 may be used to pass any one of the function output copies 904, 906, and 908. Data that is output on line 912 while the ERROR 914 signal is asserted may either be discarded or be subject to additional error checking or verification.

Generally, the circuitry of FIG. 8 and FIG. 9 may be used in critical circuitry to prevent errors from occurring or to ensure that erroneous data is caught immediately. Including DMR circuitry of FIG. 8 or TMR circuitry of FIG. 9 into a logical circuit may reduce the criticality or error sensitivity rating of the logical circuit (such as in an SMH lookup file) because the logical circuit is now endowed with the capability of detecting its own errors and taking appropriate corrective measures.

TABLE 2

| COPY 904 | COPY 906 | COPY 908 | ERROR |
|---|---|---|---|
| 0 | 0 | 0 | 0 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

Figure 10:
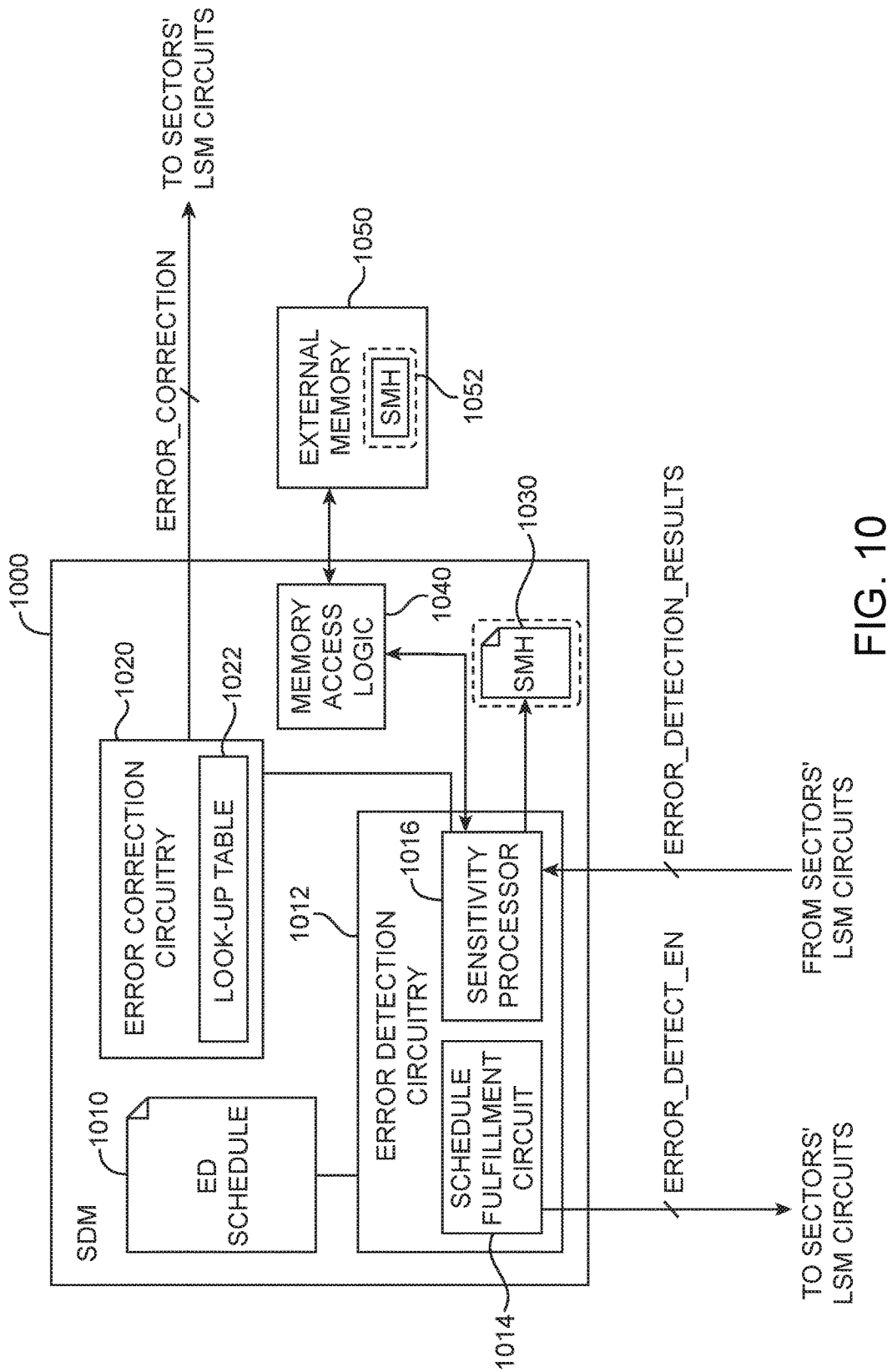
FIG. 10 is a diagram of secure device manager (SDM) circuitry that interfaces with sectors of CRAM in accordance with an embodiment.

FIG. 10 illustrates secure device manager (SDM) circuitry that interfaces with CRAM sectors. An SDM 1000 may be similar to the SDM 224 of FIG. 2 or the SDM 324 of FIG. 3. To avoid obfuscation of the present invention, only the error detection and correction aspects of the SDM 1000 will be discussed. An SDM 1000 may be provided with an error detection (ED) schedule 1010. This schedule 1010 may be a prioritized error detection schedule. As discussed above, conventional error detection schedules may simply be a list of all of the CRAM sectors such as the CRAM sectors 220 of FIG. 2. Consequently, the error detection under a conventional scheme would be a sequential traversal of each of the CRAM sectors 220 of FIG. 2. A prioritized error detection schedule, however, may allow certain sectors to be checked more frequently than other sectors.

The error detection schedule 1010 may be provided to the error detection circuitry 1012. Error detection circuitry 1012 may include a schedule fulfilment circuit 1014 and a sensitivity processor 1016. The schedule fulfillment circuit 1014 may be responsible for enabling error detection operations in the LSM circuits (such as the LSMs 222 of FIG. 2) associated with the CRAM sectors in an array (such as the CRAM sectors 220). Specifically, the schedule fulfillment circuit 1014 may provide a respective error detection enable signal ERROR_DETECT_EN to each LSM that is coupled to a CRAM sector. In other words, each or the LSMs 22 of FIG. 2 may receive a respective portion of the ERROR_DETECT_EN signal. When the bit of the ERROR_DETECT_EN signal provided to a particular LSM is asserted, the error detection circuitry (such as error detection circuitry 326 of FIG. 3) within the LSM may be activated and used to perform error detection operations on the CRAM sector that is coupled to the LSM.

As an example, if the error detection schedule 1010 provided to the schedule fulfillment circuitry 1014 is the schedule of FIG. 12, the ERROR_DETECT_EN bits corresponding to the respective sectors shown in the schedule of FIG. 12 would be sequentially asserted as the indices of the schedule are traversed. As an example, at a first time (assuming that only one sector performs error detection at any given time), the ERROR_DETECT_EN bit provided to the LSM of CRAM sector 1 may be asserted (according to index 1 of FIG. 12). At a subsequent time (i.e., after the error detection on sector 1 is complete), the ERROR_DETECT_EN bit provided to the LSM of CRAM sector 3 may be asserted (according to index 2 of FIG. 12). In general, the ERROR_DETECT_EN bit provided to the sectors prescribed in a prioritized schedule may be asserted in a sequence determined by the indices of the prioritized schedule.

If the error detection circuitry 326 (see FIG. 3) determines, via a cyclic redundancy check (CRC), parity bits, or any other suitable error detection method, that an error is present in the CRAM sector coupled to the error detection circuitry 326, then the LSM 322 that contains the error detection circuitry 326 may assert a bit in the ERROR_DETECTION_RESULTS signal provided by the LSMs of the CRAM sectors to the sensitivity processor 1016. Upon receiving an asserted error signal from one of the LSMs for the CRAM sectors at the sensitivity processor 1016, a sensitivity map header (SMH) file may be accessed to determine the criticality level of the error.

The SMH file 1030 may be provided on the SDM 1000 itself. Alternatively, the SMH file 1052 may be located on external memory 1050 that is accessed by the sensitivity processor 1016 using the memory access logic 1040. If, for example, the LSM coupled to a first CRAM sector detected an error in the CRAM sector, then a bit corresponding to the first CRAM sector in ERROR_DETECTION_RESULTS may be asserted. The sensitivity processor 1016 may receive this asserted bit and access the SMH file 1030 on the SDM 1000 itself or the SMH file 1052 on external memory 1050. The SMH file may, as shown in FIG. 11, detail, for any given physical CRAM sector location $W_i$, a corresponding logical location $X_i$. The logical location $X_i$ may include an indication of the particular device resource grouping that the CRAM sector location $W_i$ configures. The following discussions of SMH files and SMH lookup operations are illustrative and do not serve to limit the scope of the present invention. While SMH lookups are described as a means by which physical locations can be mapped to logical locations or functions in the integrated circuit, such lookups can alternatively be performed with generic lookup files (as described in connection with FIG. 5).

A generic lookup file that maps any given CRAM sector (i.e., a physical location) to a particular device resource type or logical partition configured by the CRAM sector (i.e., a logical location) may be used in place of a SMH file. It should therefore be understood that all mentions of SMH files and SMH lookups can be interchanged with generic lookup files and generic lookups. Such generic lookup files may include sensitivity tags and corrective actions associated with the logical location corresponding to any given CRAM sector (in addition to the logical locations themselves), thus obviating the need for additional sensitivity processing/lookups to determine the sensitivity of an error once the corresponding logical location of the error has been determined.

For the purposes of illustrating the processes associated with determining the sensitivity and corrective actions associated with a CRAM sector affected by SEUs, the example of an SMH file lookup will be used. Taking the examples of FIG. 11, if an error is detected in CRAM sector 1, an SMH lookup may describe the logical location of the CRAM sector as "Control circuitry." In other words, the SMH lookup may indicate that the logical location or the device resource grouping that is configured by the CRAM cells in sector 1 is control circuitry.

If an error is detected in CRAM sector 1001, an SMH lookup may describe the logical location of the CRAM sector as "Datapath" or "Accelerator" circuitry. In other words, the SMH lookup may indicate that the logical location or the device resource grouping that is configured by the CRAM cells in sector 1001 is datapath/accelerator circuitry. Depending on the application that is mapped by the SMH file, there may or may not be accelerator circuitry, and only the general "datapath" label may be applicable to a device resource configured by sector 1001.

If an error is detected in CRAM sector 2001, an SMH lookup may describe the logical location of the CRAM sector as "Statistics" or "Monitoring" circuitry. In other words, the SMH lookup may indicate that the logical location or the device resource grouping that is configured by the CRAM cells in sector 2001 is statistics/monitoring circuitry that is responsible for monitoring performance or operational metrics of datapath and/or control circuitry in a particular application.

If an errant CRAM sector includes bits configuring different types of circuitry (e.g., if a first subset of a given CRAM sector configures both control circuitry and datapath circuitry), the SMH lookup of the errant CRAM sector may be labeled as the device resource type with the higher criticality level to ensure that the corrective action (described in greater detail below in connection with the error correction circuitry 1020) is directed at the worst-case scenario—that the erroneous bits in the errant CRAM sector are used to configure the more critical of the device resources configured by the CRAM sector.

Returning to FIG. 10, the sensitivity processor 1016 may perform the SMH lookup of the device resource that is configured by the CRAM sector that is indicated to include an erroneous bit by the ERROR_DETECTION_RESULTS signal received from the LSM coupled to the CRAM sector. The SMH lookup (or generally, any physical location to logical location lookup) of the device resource configured by the CRAM sector with the erroneous bit may produce results in the manner described in connection with the first two columns of FIG. 11 (i.e., a relationship between the physical CRAM sector location $W_i$ and a logical location $X_i$ may be revealed through the SMH lookup).

The sensitivity processor may then assign or tag the CRAM sector with the erroneous bit with a criticality level. The criticality level may indicate how critical an error is to the operation of the integrated circuit or the user design implemented on a programmable integrated circuit. The criticality level may also indicate how urgent corrective action for a CRAM sector configuring the particular device resource is.

As mentioned above in connection with the DMR and TMR circuitry of FIGS. 8 and 9, error detection capabilities may be embedded within logic designs through the use of redundant logic circuitry that creates copies of function outputs that can be compared to one another to detect when an error has occurred. The inclusion of multi-mode redundancy into circuitry of a particular device resource type may reduce the criticality level associated with the particular device resource type. For example, control circuitry, which is ordinarily associated with a high level of criticality (as is indicated by the third column in the second row of FIG. 11), may be tagged as a medium or low criticality level if the control circuitry includes multi-mode redundancy circuits to provide error detection capabilities independent of the error correction functionality provided by the LSMs (such as LSM 222 and 322 of FIGS. 2 and 3) as orchestrated by the SDM (such as SDM 224, 324, and 1000 of FIGS. 2, 3, and 10). As mentioned above in connection with FIG. 2, LSMs may be implemented using processing circuitry, state machines, or any other suitable logic circuitry.

To avoid unnecessary obfuscation of the present invention, however, it will be assumed that none of the device resource types described in connection with FIG. 11 is implemented with DMR, TMR, or any multi-mode redundancy circuits. The table of FIG. 11 shows, for each physical location of a sector $W_i$ that is (through a SMH lookup) mapped to a logical location $X_i$, there is a corresponding criticality level $Y_i$ that can be assigned to the location $X_i$ by the sensitivity processor 1016. This criticality level $Y_i$ may be loaded or specified by the user during a configuration mode of the integrated circuit, or it may be dynamically adjusted during runtime based on the operating conditions of the integrated circuit. For example, if a given circuit is being used more often than other circuits, the sensitivity tag for the given circuit may be adjusted.

Per FIG. 11, control circuitry configured by CRAM sector 1 may have a high criticality level for its sensitivity tag assigned by the sensitivity processor 1016 as shown in the second row of FIG. 11. Turning to the example of FIG. 5, this would mean that CRAM sectors in the region 552 that configure the control circuitry 544 may be tagged as having a high criticality level by the sensitivity processor 1016. In the example of FIG. 6, CRAM sectors in between rows 682 and columns 672 that configure the control circuitry 662 may be tagged as having a high criticality level by the sensitivity processor 1016. In the example of FIG. 7, CRAM sectors configuring the address generator circuit 712 may be tagged as having a high criticality level by the sensitivity processor 1016.

As also shown in FIG. 11, datapath/accelerator circuitry may be tagged as having a medium criticality level for its sensitivity tag assigned by the sensitivity processor 1016. Turning to the example of FIG. 5, this would mean that CRAM sectors in columns 556 (or, the regions 558) that configure the accelerator circuits 546 may be tagged as having a medium criticality level by the sensitivity processor 1016. In the example of FIG. 6, CRAM sectors in between rows 684 and columns 676 that configure the datapath/user-logic circuitry 666 may be tagged as having a medium criticality level by the sensitivity processor 1016. In the example of FIG. 7, CRAM sectors configuring the processing circuitry 714 may be tagged as having a medium criticality level by the sensitivity processor 1016.

FIG. 11 also shows that statistics/monitoring circuitry may be tagged as having a low criticality level for its sensitivity tag assigned by the sensitivity processor 1016. In the example of FIG. 6, the CRAM sectors between rows 686 and columns 674 configuring the statistics circuitry 664 may be tagged as having a low criticality level by the sensitivity processor 1016.

Sensitivity processor 1016 may forward both the SMH lookup result for the particular CRAM sector with an erroneous bit and the criticality level (or, sensitivity tag) associated with the device resource or logical location configured by the particular CRAM sector to error correction circuitry 1020. Error correction circuitry 1020 may include a look-up table 1022 that maps the SMH lookup result $X_i$ for a given physical CRAM sector location $W_i$ along with a sensitivity tag or criticality level $Y_i$ provided by the sensitivity processor 1016 to a corrective action $Z_i$.

As shown in FIG. 11, the corrective action for an error in sector 1, corresponding to a high criticality error associated with control circuitry, may be a frame rewrite on the CRAM sector or partial reconfiguration of the errant CRAM sector (per the look-up table 1022). A frame in the CRAM sector may be a data word spanning a number of bits that is less than the size of the entire CRAM sector. Using the data register (such as register 350 of FIG. 3) and the address register (such as register 352 of FIG. 3), the LSM for a given CRAM sector may be able to rewrite the frame in a CRAM sector that was identified as containing an erroneous bit. Alternatively, a partial reconfiguration of the integrated circuit may be performed to restore the original configuration data into part of the CRAM sector (or, the entire CRAM sector).

Per look-up table 1022, corrective action for an error in sector 1001, corresponding to a medium criticality error associated with datapath/accelerator circuitry, may be waiting (i.e., no corrective action) or a partial reconfiguration. Errors in control logic may affect the integrity of the system while errors in datapath logic may represent errors in the data payload. Because data payload is often considered to be flow-through data (i.e., non-persistent data that is not used to configure subordinate circuitry) and protected by higher-level protocols (e.g., an end to end CRC integrity check on the payload across the internet), errors in payload may be seen as important. In the situation where datapath errors are considered to be flow-through data, waiting or taking no corrective action may be appropriate. Alternatively, a partial reconfiguration in the CRAM sectors configuring the datapath/accelerator circuitry may be performed to rectify a detected error and restore the desired configuration values.

Per look-up table 1022, corrective action for an error in sector 2001, corresponding to a low criticality error associated with statistics/monitoring circuitry, may be resetting the statistics stored by the circuitry by resetting registers used by the circuitry.

After determining, using look-up table 1022, the corrective action $Z_i$ that is appropriate for the device resource type $X_i$ and criticality level $Y_i$, error correction circuitry 1020 may output a control ERROR_CORRECTION to the error correction circuitry 328 (see FIG. 3) in the LSM associated with the CRAM sector at location $W_i$. The LSM associated with the CRAM sector at location $W_i$ may receive the ERROR_CORRECTION control signal and perform the corrective action $Z_i$ prescribed by the lookup table 1022.

Generally, any device resource group or logical partition of an integrated circuit $X_i$ may have any associated criticality level $Y_i$ and corrective action $Z_i$. The examples of logical partitions or device resource groupings in FIGS. 5-7 and FIG. 10 are merely illustrative and do not serve to limit the scope of the present invention. Similarly, the examples of device resource groupings $X_i$ in FIG. 11 (i.e., the groupings "CONTROL CIRCUITRY," "DATAPATH/ACCELERATOR CIRCUITRY," and "STATISTICS/MONITORING CIRCUITRY") are illustrative and not limiting to the scope of the present invention. Generally, there may be any number of device resource groupings. Each of the device resource groups may have any associated criticality level $Y_i$ and may have any associated corrective action $Z_i$. As mentioned above in connection with the DMR and TMR circuits of FIGS. 8 and 9, the addition of DMR and TMR circuits in any one of the device resource groupings may warrant or serve to effect a change in the criticality level $Y_i$ of the particular device resource group.

If a first device resource group ordinarily has a first criticality rating but is provided with DMR and/or TMR circuitry, the criticality rating of the first device resource group may be lowered to a second criticality that is lower than the first criticality rating. As an example, if control circuitry is ordinarily considered to be highly critical (thereby warranting very frequent error detection in the CRAM sectors used to configure the control circuitry) but is provided with DMR and/or TMR circuitry, then the control circuitry may be considered to be a device resource group of medium or low criticality (because it is not as urgent to perform error detection as often—the built in DMR/TMR circuitry will reveal errors).

FIG. 12 is an example of a prioritized error detection schedule similar to the schedule that may be provided as the schedule 1010 of FIG. 10. An error detection schedule such as the prioritized error detection schedule of FIG. 12 may include an ordered/indexed list of sectors to be checked for errors according to the priority or criticality level of the logic circuits configured by sectors in the CRAM array. As an example, an integrated circuit may include logical circuitry that is highly critical to the operation of the integrated circuit, such as the supervisor/control circuit 544 of FIG. 5, the control circuitry 662 of FIG. 6, or the address generator circuit 712 of FIG. 7.

To ensure that the critical circuitry is functioning without any errors during operation of the integrated circuit, it may be desirable to check the CRAM sectors that configure the critical circuitry more often than the CRAM sectors that configure less critical or non-critical circuitry. In the example of FIG. 5, these CRAM sectors would be the sectors in region 552 (or the sectors in columns 554), while in the example of FIG. 6, these sectors may be the sectors bounded by rows 682 and columns 672. In the example of FIG. 12, the sectors configuring critical circuitry are assumed to only be sectors 1 and 2, to avoid unnecessary obfuscation of the present invention.

In embodiments where multiple CRAM sectors can be checked for errors simultaneously, the "sector" number in FIGS. 12-14 may correspond to sets of sectors (i.e., "sector 1" as indicated in FIGS. 12-14 may correspond to a "first set of sectors" while "sector 2" as indicated in FIGS. 12-14 may correspond to a "second set of sectors").

As shown in FIG. 12, the indexed/ordered list of sectors may traverse or include nine sectors, albeit at different frequencies. As an example, there is a first distance 1200 between subsequent instances of sector 1 in the prioritized error detection schedule, specifically, a distance of four indices. In other words, sector 1 is checked once every four sectors—a first frequency. Sectors that are not as critical as sector 1, such as sectors 3-9, are checked once every fourteen sectors—a second frequency that is less than the first frequency. As an example, there is a second distance 1204 separating subsequent instances of sector 3 in the prioritized error detection schedule, specifically, a distance of fourteen indices.

Just as sector 1 is assumed to correspond to a CRAM sector configuring critical circuitry, sector 2 is also assumed to correspond to a CRAM sector configuring critical circuitry. Correspondingly, a third distance 1202 of four indices that is equal to the first distance 1200 separates subsequent instances of sector 2 in the prioritized error detection schedule of FIG. 12. Since sector 4, like sector 3, is assumed to correspond to a CRAM sector configuring less critical circuitry, a fourth distance 1206 of fourteen indices separates subsequent instances of sector 4 in the prioritized error detection schedule of FIG. 12.

Generally, sectors of CRAM that configure critical circuitry (such as sectors 1 and 2) may be checked for errors at a higher frequency (e.g., once every 4 sectors, as shown in FIG. 12) than the frequency (e.g., once every 14 sectors) at which sectors of CRAM that configure less critical circuitry (such as sectors 3-9) are checked for errors.

The indices associated with the sectors as illustrated in FIGS. 12-14 merely indicate separate time allocations for performing the error checking. Taking the example of FIG.

12, and assuming that only a single sector is checked at any given time, sector 1 may be checked for errors during a first interval, sector 3 may be checked during a second interval immediately following the first interval, sector 2 may be checked during a third interval immediately following the second interval, sector 4 may be checked during a fourth interval immediately following the third interval, and so on.

FIG. 13 shows an example of a prioritized error detection schedule for eight sectors. In the example of FIG. 13, sector 3 has been removed from the prioritized error detection schedule of FIG. 12. In an accelerator system, for example, it is common that one accelerator slot may be unused for a period of time. According to a further embodiment of the present invention, the SDM (such as SDM 1000 of FIG. 10) computes a dynamic schedule wherein it is notified that a slot is unused, and it computes a modified schedule that skips all sectors associated with that accelerator. In the example of FIG. 13, sector 3 may be a CRAM sector that configures or is associated with the accelerator slot that is unused for an interval having a duration exceeding a threshold duration. The schedule of FIG. 12 may be modified by the SDM to remove the error detection intervals (indicated by the indices) dedicated to sector 3. Removing the CRAM sector associated with an unused logic element decreases the error detection latency for the remaining sectors, for the duration that the slot is unoccupied or unused. As seen in FIG. 13, FIG. 4 is checked once every thirteen sectors in the modified schedule of FIG. 13, as opposed to once every fourteen sectors in the original schedule of FIG. 12.

According to a further embodiment, the scheduler (automatically as part of a normal compile) avoids the use of a given sector in an under-utilized device and deletes it statically from the ED schedule. This mechanism has particular value for devices, which are sold as virtualized from some physical larger device.

Monitoring circuitry in the SDM may also detect when a given sector is brought back into use or newly brought into use. As an example, if the original prioritized error detection schedule was the schedule of FIG. 13 and a logic circuit configured by sector 3 was brought back into use or newly brought into use, the SDM may modify the prioritized error detection schedule such that sector 3 is checked with a frequency commensurate to the criticality of the logic circuit configured by sector 3 (i.e., the SDM may modify the schedule of FIG. 13 to produce the schedule of FIG. 12, in which sector 3 is checked). In the present example, the logic circuit configured by or associated with sector 3 may be of lesser criticality than the logic circuits configured by or associated with sectors 1 and 2, meaning that when it is added to the schedule of FIG. 13, it is added such that it appears with a lower frequency than sectors 1 and 2 appear in the prioritized error detection schedule.

Further improvements are possible for some application profiles. For an application with, for example, 25% critical and 75% non-critical circuitry, a schedule such as the schedule of FIG. 14 may be used. Control logic, such as the SDM, may be used to identify maintenance times where critical operations (such as writing shared memory) may be delayed or temporarily suspended when non-critical logic is to be serviced or utilized. Taking the same assumptions made in connection with FIGS. 12 and 13, where the sectors 1 and 2 are considered to be more critical than the remaining sectors, an operation interval 1402 marked by the indices 1-8 may correspond to a period during which the critical circuitry configured by or associated with sectors 1 and 2 is used. Assuming, as an example, that the error detection operations on a single sector takes 1 ms, it may be known (a priori) that the critical circuitry configured by sectors 1 and 2 is active for 8 ms before entering a maintenance or suspended mode for 4 ms.

During the 8 ms active operation of the critical circuitry configured by sectors 1 and 2 in the operation interval 1402, sectors 1 and 2 may be checked every other sector (i.e., once every two sectors). This ensures that any errors that occur in sectors 1 and 2 are not left undetected for any longer than 1 ms during the operation of the critical circuitry. When, after the 8 ms active operation of the critical circuitry in the operation interval 1402, the critical circuitry is temporarily halted or maintained, the remaining sectors such as sectors 3-6 may be checked for errors in a maintenance interval 1404. Once the maintenance interval 1404 ends and the critical circuitry resumes active operation (i.e., at index 13), the high frequency (or, every-other-index) error detection of sectors 1 and 2 may resume.

Figure 15:
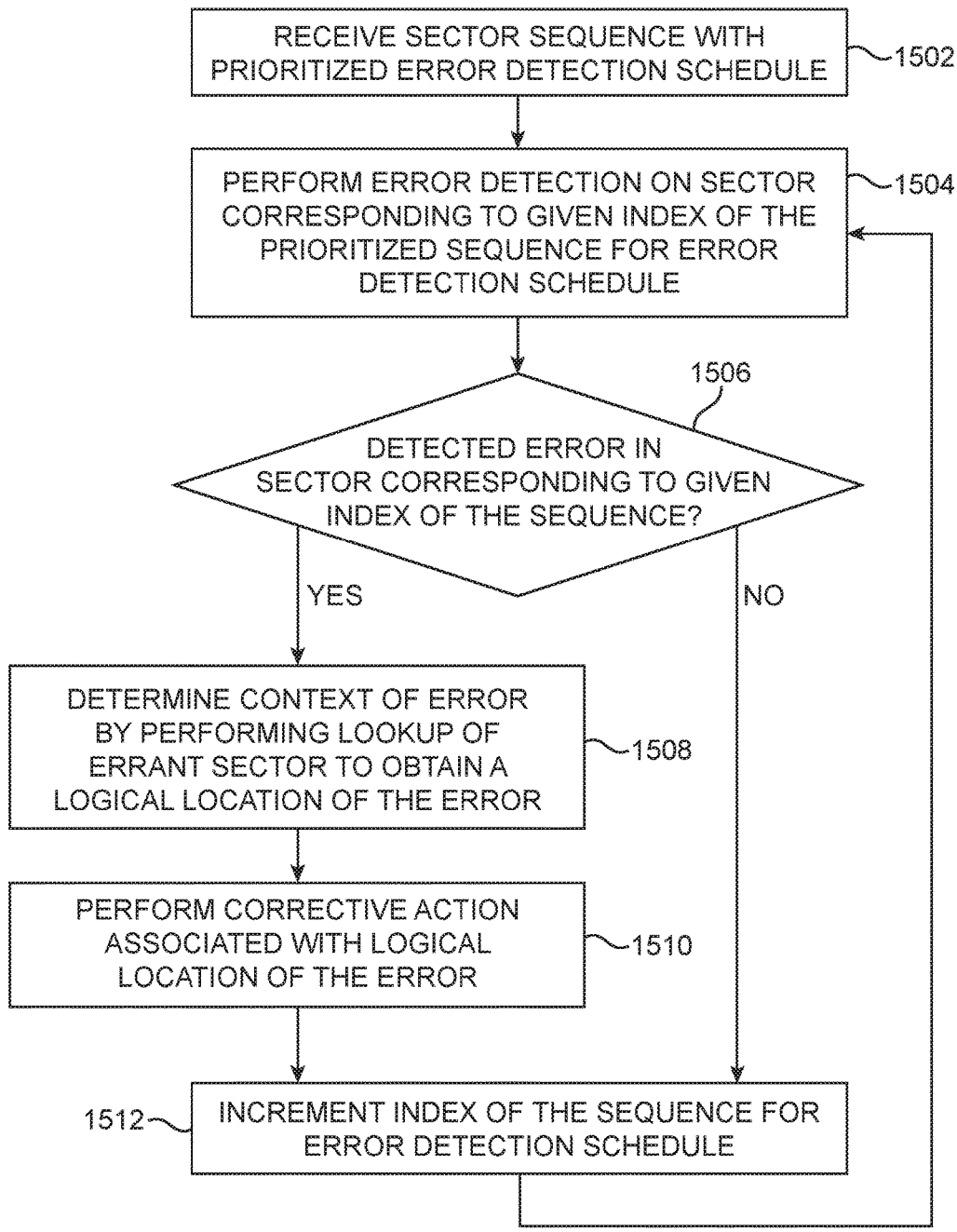
FIG. 15 is a flowchart of steps for detecting errors according to a prioritized error detection schedule in accordance with an embodiment.

FIG. 15 is a flowchart of steps for detecting errors according to a prioritized error detection schedule. At step 1502, SDM circuitry such as SDM 1000 of FIG. 10 may receive a prioritized error detection schedule such as the error detection schedule 1010 of FIG. 10. The error detection schedule 1010 of FIG. 10 may be received at the SDM during configuration of the integrated circuit. At step 1504, the SDM may instruct an LSM coupled to a sector at a given index of the prioritized error detection schedule 1010 to perform error detection operations on the sector. As an example, step 1504 may be performed by selective assertion of the bit of ERROR_DETECT_EN provided by the schedule fulfillment circuit 1014 to the LSM coupled to the sector at the given index of the prioritized error detection schedule.

If, as an example, the schedule of FIG. 12 was the prioritized error detection schedule received in step 1502, at step 1504, sector 1 (corresponding to index 1 of FIG. 12) would be checked for errors the first time step 1504 is performed. Sector 1 may be checked for errors by asserting the bit of ERROR_DETECT_EN that is provided by the SDM 1000 to the LSM coupled to sector 1. After error detection is performed on a sector in step 1504, the SDM may determine, in step 1506, whether an error was detected in the sector checked in step 1504.

If an error was not detected in step 1504, then the method may proceed from step 1506 to step 1512, where the index to be checked in the prioritized error detection schedule is incremented. As an example, if the index checked in step 1504 was 1, the index may be incremented in step 1512 to 2 and the method may return to step 1504, where the sector corresponding to index 2 (i.e., sector 3, in the example of FIG. 12) may be checked for errors.

If an error was detected in the sector checked at step 1504, however, then the method may proceed from step 1506 to step 1508, where the context of the error may be determined by performing a lookup of the errant sector to obtain a logical location of the error. Step 1508 may be performed by receiving an ERROR_DETECTION_RESULTS signal from an LSM circuit coupled to the sector checked in step 1504 at a sensitivity processor 1016 of FIG. 10. The sensitivity processor 1016 may then perform a SMH lookup by accessing an SMH file 1030 on the SDM 1000 or an SMH file 1052 on external memory 1050. As described in connection with FIG. 11, an SMH lookup may map a physical sector location $W_i$ to a corresponding logical location or a device resource grouping $X_i$. If, as an example, it was determined in steps 1504 and 1506 that sector 1 (which was assumed to relate to critical control circuitry in the discussion of FIG. 12) had an error, then the SMH lookup may indicate that the sector corresponds to control logic circuitry.

At step 1510, corrective action associated with the logical location of the error may be performed. To perform corrective action associated with the logical location of the error, a criticality level associated with the logical location may be determined. Sensitivity processor 1016 may assign a criticality level $Y_i$ for the SMH lookup result (i.e., the logical location of the errant sector) as described in connection with FIG. 11 above. A look-up table such as table 1022 of FIG. 10 in error correction circuitry may list an appropriate corrective action $Z_i$ for a given logical location or device resource grouping $X_i$ and/or criticality level $Y_i$. The appropriate corrective action may be performed by relaying, with error correction circuitry 1020 at the SDM 1000, an ERROR_CORRECTION signal with instructions or control signals that initiate the corrective action to error correction circuitry (such as circuitry 328 of FIG. 3) in the LSM circuit coupled to the errant sector.

Finally, after corrective action is performed in step 1510, the method may advance to step 1512 where the index in the prioritized error detection schedule that specifies the sector to be checked for errors is incremented.

Figure 16:
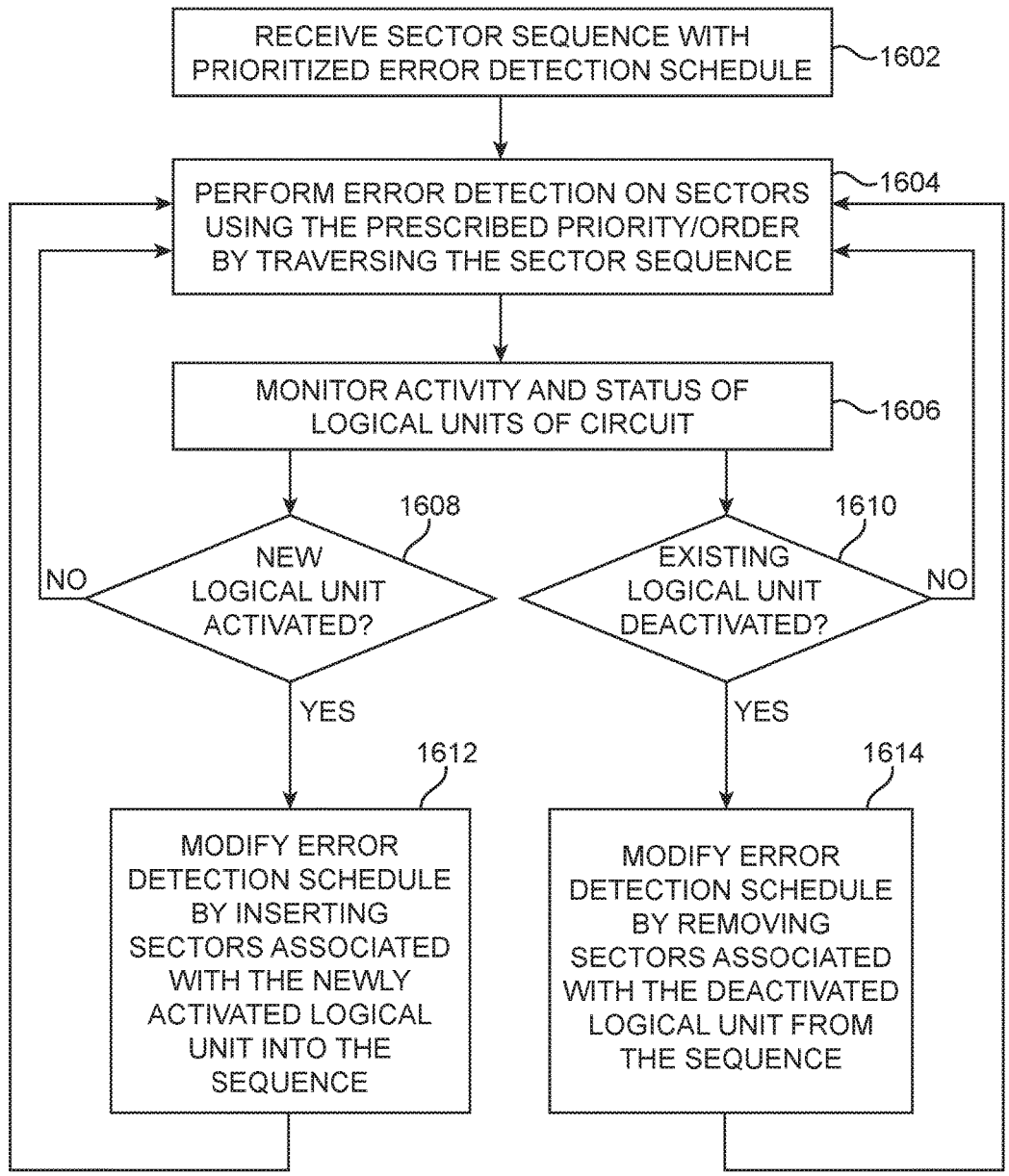
FIG. 16 is a flowchart of steps for updating a prioritized error detection schedule in accordance with an embodiment.

FIG. 16 is a flowchart of steps for updating a prioritized error detection schedule. The method of FIG. 16 may be performed as a part of the method of FIG. 15 and simultaneously with the method FIG. 15—the separation of the method into two diagrams is intended only to simplify the illustration of the method. At step 1602, a sector sequence may be received in a prioritized error detection schedule (similar to step 1502 of FIG. 15). Then, similar to the method described in FIG. 15 (i.e., steps 1504-1512), error detection may be performed on sectors in the order listed in the sector sequence prescribed by the prioritized error detection schedule in step 1604. While the sectors are checked for errors in the order specified by the sequence in the prioritized error detection schedule in step 1604, the activity and status of logical circuitry on the integrated circuit may be monitored in step 1606. Steps 1606 and 1604 may be performed simultaneously.

As described above in connection with FIGS. 12 and 13, when the SDM monitors logical circuitry, it can be notified when a logic circuit (such as datapath circuitry or an accelerator slot) is unused for a duration of time exceeding a threshold duration. The SDM can also be notified when a logic circuit is temporarily halted or taken out of use from the user application. The SDM can, using the SMH file 1030, determine the physical locations of the CRAM sectors ($W_i$ in the example of FIG. 11) corresponding to the logical locations ($X_i$ in the example of FIG. 11) of the logic circuits that are deactivated.

Upon determining that an existing logical unit or circuit is deactivated (i.e., determining that the logical unit is unused for a duration exceeding a threshold duration or that the logical unit is removed from use in the user application) in step 1610, the SDM may determine (using the SMH file) physical locations of the CRAM sectors that configure the unused logic sectors. At step 1614, the SDM may modify the prioritized error detection schedule (such as schedule 1010 of FIG. 10) to remove indices that prescribe an error detection operation in CRAM sectors that configure the now deactivated logical unit or circuit. In the examples of FIGS. 12 and 13, sector 3 may be an example of a sector that configures circuitry that is deactivated. An original prioritized error detection schedule of FIG. 12 may be modified by removing instances of sector 3 in the sequence to produce the prioritized error detection schedule of FIG. 13.

Conversely, if it is determined that a new or previously deactivated logical unit is activated in step 1608, the SDM may modify the prioritized error detection schedule to include sectors that configure the activated logical unit into the prioritized error detection schedule in step 1612 at a frequency that is based on the criticality level of the logical unit. In the example of FIGS. 12 and 13, if the original prioritized error detection is the schedule of FIG. 13 and it is detected in step 1608 that circuitry configured by sector 3 is activated, the SDM may modify the schedule of FIG. 13 to produce the schedule of FIG. 12 by inserting instances of sector 3 into the schedule at a frequency that is appropriate for less-than-critical circuitry (assuming that the circuitry configured by sector 3 is less-than-critical circuitry). When the error detection schedule is modified in step 1612, the inserted instances of CRAM sectors to be checked in a prioritized error detection schedule may have any frequency (i.e., they can be inserted such that a sector is checked every other cycle, every three cycles, or any other suitable frequency based on the criticality level of the circuitry configured by the CRAM sectors).

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for performing prioritized error detection on an array of memory cells used by an integrated circuit, the method comprising:
    at error detection circuitry, receiving a prioritized error detection schedule that prescribes more frequent error detection for a first subset of the array of memory cells and less frequent error detection for a second subset of the array of memory cells; and
    with the error detection circuitry, performing prioritized error detection on the array of memory cells based on the prioritized error detection schedule;
    with the error detection circuitry, performing error detection on the first subset of the array of memory cells with a first frequency based on the prioritized error detection schedule; and
    with the error detection circuitry, performing error detection on the second subset of the array of memory cells with a second frequency that is less than the first frequency based on the prioritized error detection schedule.

2. The method defined in claim 1, further comprising:
    in response to performing prioritized error detection on the array of memory cells, detecting an error in a first memory cell in the first subset of the array of memory cells; and
    in response to detecting the error in the first subset of the array of memory cells, determining the context of the error by performing a lookup of the first memory cell using a sensitivity map.

3. The method defined in claim 2, further comprising:
    in response to performing a lookup of the first memory cell using the sensitivity map, obtaining a logical location corresponding to the first memory cell; and determining, using a sensitivity processor, a criticality level associated with the logical location.

4. The method defined in claim 3, further comprising:
determining, using a lookup table, a corrective action for the first memory cell based on the criticality level and the logical location.

5. The method defined in claim 4, further comprising:
performing the corrective action for the first memory cell.

6. The method defined in claim 5, wherein the integrated circuit comprises a programmable integrated circuit, and wherein performing the corrective action for the first memory cell comprises:
performing a partial reconfiguration of the programmable integrated circuit to correct the error in the first memory cell.

7. The method defined in claim 5, wherein performing the corrective action for the first memory cell comprises:
rewriting a frame of the first subset of the array of memory cells.

8. The method defined in claim 1, wherein a first logic circuit configured by the first subset of the array of memory cells has a first criticality level, the method further comprising:
detecting activation of a second logic circuit having a second criticality level that is greater than the first criticality level;
determining that the second logic circuit has built-in error detection circuitry and is configured by a third subset of the array of memory cells; and
modifying the prioritized error detection schedule to include the third subset of the array of memory cells.

9. The method defined in claim 8, wherein modifying the prioritized error detection schedule comprises:
modifying the prioritized error detection schedule to prescribe less frequent error detection for the third subset of the array of memory cells relative to the first subset of the array of memory cells.

10. The method defined in claim 1, further comprising:
monitoring the activity of a plurality of logic circuits on the integrated circuit, wherein the plurality of logic circuits are configured by the array of memory cells;
in response to determining that a first logic circuit of the plurality of logic circuits is deactivated, modifying the prioritized error detection schedule to exclude subsets of the array of memory cells that configure the first logic circuit; and
with the error detection circuitry, performing prioritized error detection on the array of memory cells based on the modified prioritized error detection schedule.

11. The method of claim 1, further comprising:
monitoring the activity of a plurality of logic circuits on the integrated circuit, wherein the plurality of logic circuits are configured by the array of memory cells;
in response to determining that an additional logic circuit is activated, modifying the prioritized error detection schedule to include subsets of the array of memory cells that configure the additional logic circuit; and
with the error detection circuitry, performing prioritized error detection on the array of memory cells based on the modified prioritized error detection schedule.

12. An integrated circuit, wherein the integrated circuit comprises a programmable integrated circuit, comprising:

an array of memory cells that is partitioned into a plurality of sub-arrays, wherein the array of memory cells comprise configuration random access memory (CRAM) cells, and wherein the plurality of sub-arrays comprise CRAM sectors;
a plurality of error detection circuits that are each coupled to a respective sub-array of the plurality of sub-arrays;
a device manager circuit that directs the plurality of error detection circuits to perform prioritized error detection on the plurality of sub-arrays;
user-logic circuitry that is configured using a first set of CRAM sectors; and
control circuitry coupled to the user-logic circuitry, wherein the control circuitry provides control signals that direct the user-logic circuitry to perform functions, and wherein the control circuitry is configured using a second set of CRAM sectors, and wherein the device manager circuit directs the plurality of error detection circuits to check the first set of CRAM sectors for errors less frequently than the second set of CRAM sectors during the prioritized error detection.

13. The integrated circuit defined in claim 12, wherein the device manager circuit comprises:
a schedule fulfillment circuit that provides an asserted control signal to a first error detection circuit of the plurality of error detection and correction circuits, wherein the first error detection circuit performs error detection operations on its respective sub-array of memory cells in response to receiving the asserted control signal.

14. The integrated circuit defined in claim 13, wherein the schedule fulfillment also provides another asserted control signal to a second error detection circuit of the plurality of error detection and correction circuits, wherein the asserted control signal is provided to the first error detection circuit at a first frequency, and wherein the another asserted control signal is provided to the second error detection circuit at a second frequency that is different from the first frequency.

15. The integrated circuit defined in claim 12, wherein the user-logic circuitry comprises:
a plurality of hardware accelerator circuits, wherein operation of the hardware accelerator circuits is controlled by the control circuitry.

16. The integrated circuit defined in claim 12, wherein the control circuitry comprises:
address generator circuitry that interfaces with external memory coupled to the integrated circuit.

17. A method of checking for errors in an array of configuration random access memory (CRAM) cells that is partitioned into sectors, the method comprising:
at control circuitry, directing error correction circuitry to check a first set of sectors at a first frequency; and
at the control circuitry, directing the error correction circuitry to check a second set of sectors at a second frequency that is different from the first frequency;
in response to detecting an error in a first sector of the first set of sectors, performing a first corrective action; and
in response to detecting an error in a second sector of the second set of sectors, performing a second corrective action that is different from the first corrective action.

* * * * *